United States Patent
Tsuchiya et al.

(10) Patent No.: US 7,872,320 B2
(45) Date of Patent: Jan. 18, 2011

(54) MICRO-ELECTRO-MECHANICAL DEVICE AND METHOD OF MANUFACTURING THE SAME

(75) Inventors: Kaoru Tsuchiya, Kanagawa (JP); Takafumi Mizoguchi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 182 days.

(21) Appl. No.: 12/265,177

(22) Filed: Nov. 5, 2008

(65) Prior Publication Data

US 2009/0117364 A1 May 7, 2009

(30) Foreign Application Priority Data

Nov. 7, 2007 (JP) .............................. 2007-289224

(51) Int. Cl.
*H01L 29/84* (2006.01)
(52) U.S. Cl. .................. 257/415; 257/417; 257/418; 257/419; 257/420; 257/E29.324; 977/724; 977/732; 977/733
(58) Field of Classification Search ................ 257/415, 257/417–420, E29.324; 977/724, 732, 733
See application file for complete search history.

(56) References Cited

U.S. PATENT DOCUMENTS

| | | | |
|---|---|---|---|
| 6,355,964 B1* | 3/2002 | Mueller et al. ............... 257/415 |
| 6,465,280 B1* | 10/2002 | Martin et al. ................ 438/125 |
| 6,749,733 B1 | 6/2004 | Sibbett ........................ 204/450 |
| 7,030,494 B2* | 4/2006 | Aoki .......................... 257/758 |
| 7,579,663 B2* | 8/2009 | Wan ........................... 257/415 |
| 7,671,430 B2* | 3/2010 | Inaba et al. .................. 257/415 |
| 7,687,297 B2* | 3/2010 | Heck et al. ..................... 438/50 |
| 7,687,833 B2* | 3/2010 | Marty et al. ................. 257/254 |
| 2002/0171114 A1* | 11/2002 | Ishio et al. ................... 257/419 |
| 2003/0151879 A1* | 8/2003 | Yang et al. ................... 361/233 |
| 2003/0173568 A1 | 9/2003 | Asakawa et al. .............. 257/79 |
| 2004/0245588 A1* | 12/2004 | Nikkel et al. ................. 257/415 |
| 2005/0112886 A1 | 5/2005 | Asakawa et al. ............ 438/689 |
| 2006/0270238 A1 | 11/2006 | Izumi et al. .................. 438/700 |
| 2008/0128841 A1* | 6/2008 | Fujimori et al. ............. 257/418 |
| 2009/0108381 A1* | 4/2009 | Buchwalter et al. ......... 257/415 |
| 2010/0148284 A1* | 6/2010 | Watanabe et al. ........... 257/415 |

FOREIGN PATENT DOCUMENTS

| | | |
|---|---|---|
| EP | 1 324 399 A2 | 7/2003 |
| JP | 2000-273236 | 10/2000 |
| JP | 2003-258296 | 9/2003 |
| JP | 2007-001004 | 1/2007 |

* cited by examiner

*Primary Examiner*—Ida M Soward
(74) *Attorney, Agent, or Firm*—Fish & Richardson P.C.

(57) ABSTRACT

The present invention improves mechanical strength of a micro-electro-mechanical device (MEMS) having a movable portion to improve reliability. In a micro-electro-mechanical device (MEMS) having a movable portion, a portion which has been a hollow portion in the case of a conventional structure is filled with a filler material. As the filler material, a block copolymer that is highly flexible is used, for example. By filling the hollow portion, mechanical strength improves. Besides, warpage of an upper portion of a structure body in the manufacture process is prevented, whereby yield improves. A micro-electro-mechanical device thus manufactured is highly reliable.

7 Claims, 13 Drawing Sheets

FIG. 7A
(A1)
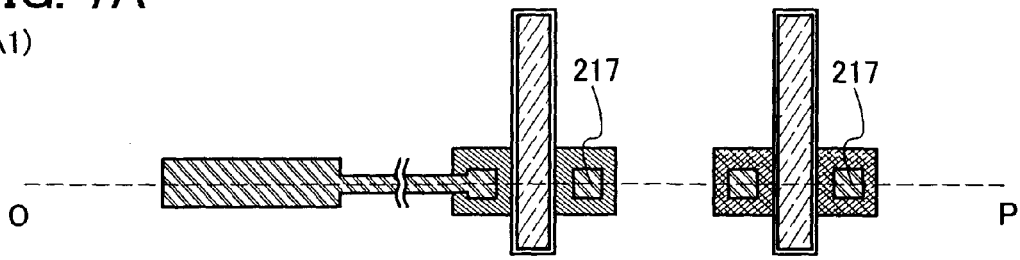
(A2)
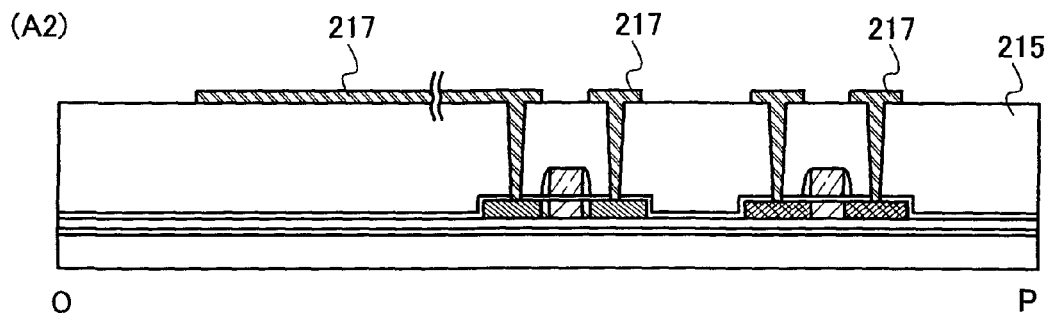
FIG. 7B
(B1)
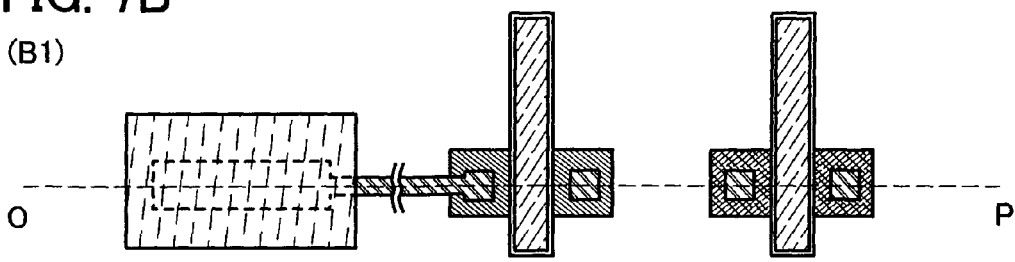
(B2)
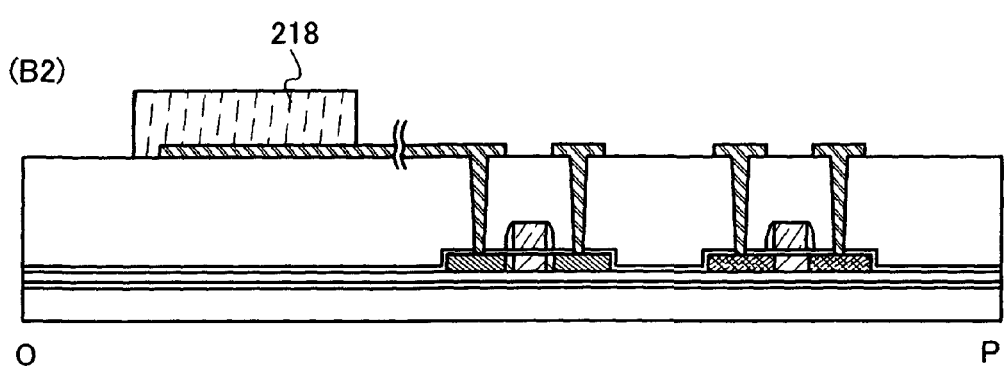

FIG. 8A
(A1)
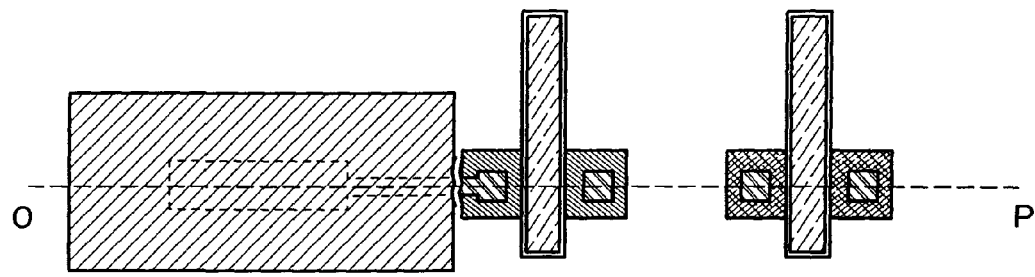
(A2)
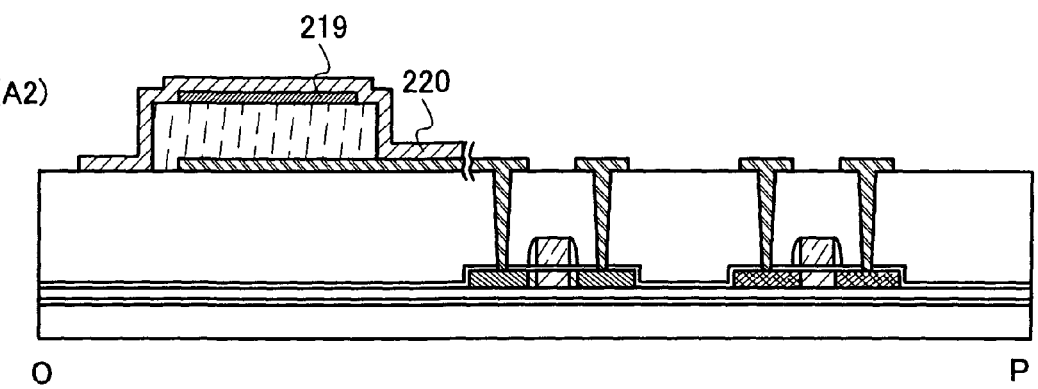
FIG. 8B
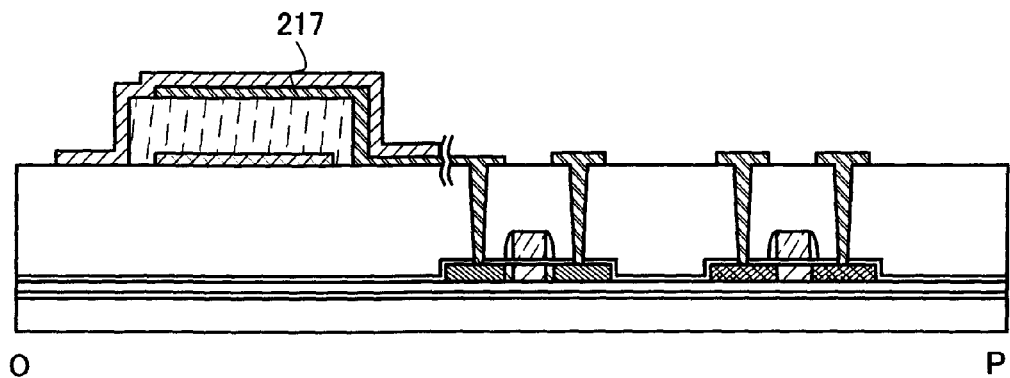

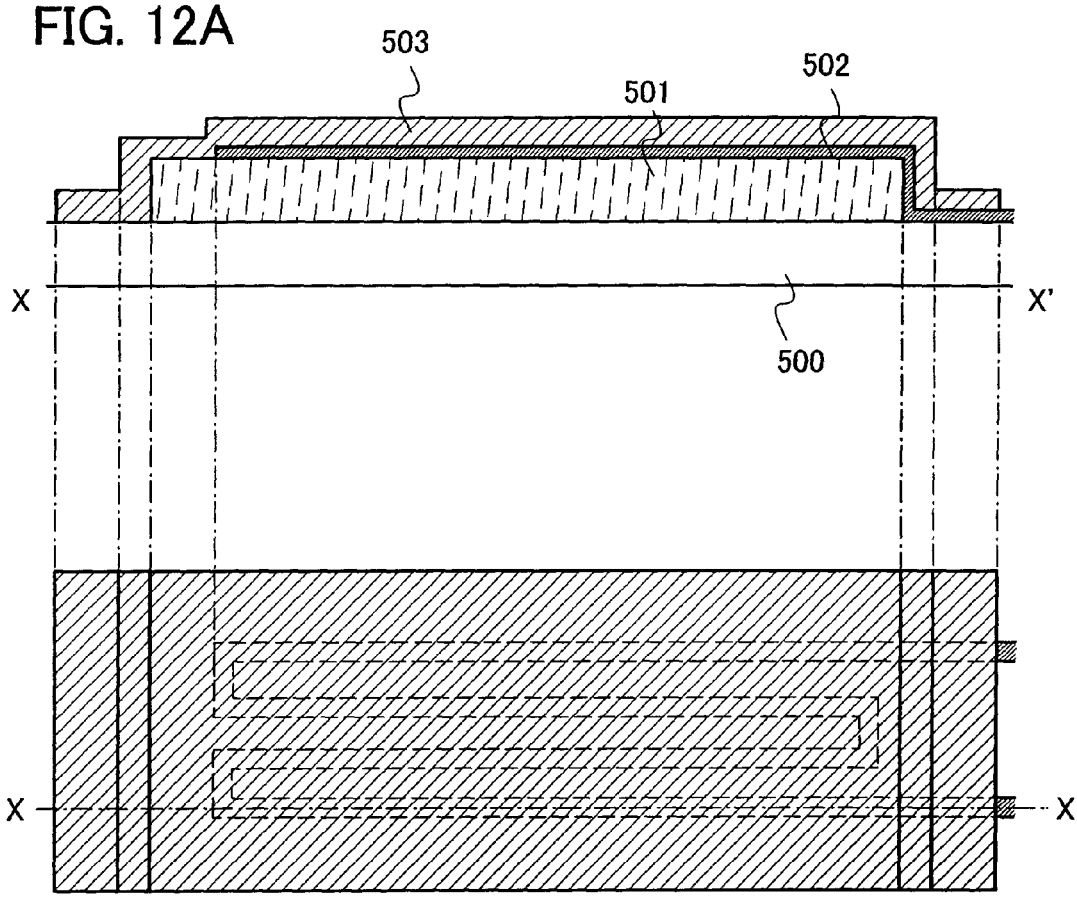

MICRO-ELECTRO-MECHANICAL DEVICE AND METHOD OF MANUFACTURING THE SAME

BACKGROUND OF THE INVENTION

1. Field of the Invention

The present invention relates to a micro-electro-mechanical device including a microstructure body provided with a movable portion. Further, the present invention relates to a method of manufacturing the micro-electro-mechanical device.

2. Description of the Related Art

In recent years, research on micro-electro-mechanical systems (MEMS) has been actively developed. "MEMS" is an acronym of a micro-electro-mechanical system and simply called a "micromachine" in some cases. The term "micromachine" generally refers to a micro device in which "a movable microstructure body having a stereoscopic structure" and "an electronic circuit having a semiconductor element" that are manufactured using a semiconductor microfabrication technology are integrated. A microstructure body described above is different from the semiconductor element and generally has a movable portion.

A microstructure body described above includes a structure layer and a hollow portion, and a structure layer includes a movable portion. Because of operation of a movable portion of a structure layer, mechanical strength is needed for a microstructure body described above. In Reference 1: Japanese Published Patent Application No. 2007-1004, as an example of a microstructure body having high mechanical strength, a micromachine that has a layer containing polycrystalline silicon crystallized by heat crystallization using metal or laser crystallization and a space below or above this layer is disclosed.

SUMMARY OF THE INVENTION

A conventional microstructure body includes a hollow portion in order to ensure an operation region of a movable portion. For forming a hollow portion, a sacrificial layer is first formed in a portion which is to be a hollow portion, after a structure layer or the like is formed, this sacrificial layer is removed by etching or the like. For example, in the case of a microstructure body in which a movable portion of a structure layer operates in a direction perpendicular to a substrate surface, a lower portion of the microstructure body is formed, a sacrificial layer is formed over this lower portion of the microstructure body, an upper portion of the microstructure body is formed over this sacrificial layer, and the sacrificial layer is removed by etching or the like. In this manner, a microstructure body including a hollow portion is formed.

However, when a hollow portion is formed using a sacrificial layer, as described above, there is a problem in that a microstructure body is easily damaged or broken due to strong contact or the like between an upper electrode and a lower electrode of the microstructure body during a manufacturing process. Further, there is a problem in that normal operation becomes impossible by sticking between an upper electrode and a lower electrode. Here, the term "sticking" means a phenomenon in which, due to operation of a movable portion of a microstructure, an upper electrode and a lower electrode are in strong contact with each other such that the upper electrode and the lower electrode can never separate from each other.

Furthermore, when a hollow portion is formed using a sacrificial layer, there is a problem in that the sacrificial layer is not completely etched whereby etching residue is generated.

Alternatively, because of operation of an upper portion of a manufactured microstructure body, the microstructure body is potentially damaged or broken. This is particularly remarkable when the height of a hollow portion is high or when the toughness of a structure layer is not enough.

Furthermore, when a hollow portion is provided, there is a problem in that a structure body including the hollow portion is deformed by, for example, being wrapped and accordingly a desired structure cannot be obtained.

The present invention provides a microstructure body having a structure in which a pair of electrodes facing each other is isolated from each other by a space, a movable structure body is provided with at least one of the electrodes, and an insulating material fills this space. As this insulating material, a material having pores such that a filler material layer made up of this insulating material can be deformed when a movable portion operates is used. It is preferable to use a material which can soften or harden by certain treatment (e.g., heat treatment or chemical solution treatment) after formation.

One aspect of the present invention is a micro-electro-mechanical device including a microstructure body. The microstructure body includes a lower electrode layer over an insulating surface; a filler material layer over the lower electrode layer; an upper electrode layer facing the lower electrode layer, over the filler material layer; and a structure layer over the upper electrode layer. The structure layer has a structure capable of moving in a direction toward the lower electrode layer or in a direction opposite to the direction toward the lower electrode layer. The filler material layer includes an insulating material provided with at least one pore reaching a surface of the filler material layer. Porosity is greater than or equal to approximately 20% and less than or equal to 80%.

In the above structure of the present invention, the porosity of the filler material layer is greater than or equal to approximately 20% and less than or equal to 80%. This is because the filler material layer itself is difficult to form or because pores included in the filler material layer are difficult to form when the porosity of the filler material layer is above or below this range.

In the above structure of the present invention, the filler material layer can be formed of a block copolymer. When the filler material layer includes a block copolymer, by setting the porosity to greater than or equal to 20% and less than or equal to 80%, the filler material layer itself or pores included in the filler material layer can be formed. More preferably, the porosity is set to greater than or equal to 20% and less than or equal to 60%. Further preferably, the porosity is set to greater than or equal to 20% and less than or equal to 35%.

One aspect of the present invention is a method of manufacturing a micro-electro-mechanical device, including the steps of forming a lower electrode layer over an insulating surface, forming a first filler material layer so as to cover the lower electrode layer, forming an upper electrode layer over the first filler material layer, forming a structure layer over the upper electrode layer, preferably performing heat treatment, and forming a porous second filler material layer by removing by etching any of the materials included in the first filler material layer.

One aspect of the present invention is a method of manufacturing a micro-electro-mechanical device, including the steps of forming a lower electrode layer over an insulating surface, forming a film including a block copolymer so as to cover an entire surface of the lower electrode layer, selectively forming a metal mask over the film formed of the block copolymer, forming a first filler material layer by etching the film formed of the block copolymer using the metal mask, forming an upper electrode layer over the first filler material layer, forming a structure layer over the upper electrode layer, preferably performing heat treatment, and forming a porous second filler material layer by removing by etching any of the materials included in the first filler material layer.

In any of the above structures of the present invention, the porosity of the second filler material layer is preferably greater than or equal to 20% and less than or equal to 80%. More preferably, the porosity is set to greater than or equal to 20% and less than or equal to 60%. Further preferably, the porosity is set to greater than or equal to 20% and less than or equal to 35%.

By applying the present invention, damage or breakage of a microstructure body due to operation of an upper portion of the manufactured microstructure body can be prevented. Accordingly, even when the height of a hollow portion is high or when the toughness of a structure layer is not enough, a microstructure body can be manufactured.

Sticking does not occur in the microstructure body to which the present invention is applied, and thus a microstructure body capable of repetitive operation can be manufactured.

Further, a sacrificial layer is not needed to be formed in a manufacturing process, and thus a microstructure body can be manufactured with high yield.

BRIEF DESCRIPTION OF THE DRAWINGS

FIGS. 6A-1 to 6C-2 illustrate an example of a method of manufacturing a micro-electro-mechanical device including a microstructure body according to one aspect of the present invention.

FIGS. 7A-1 to 7B-2 illustrate an example of a method of manufacturing a micro-electro-mechanical device including a microstructure body according to one aspect of the present invention.

FIGS. 8A-1 to 8B illustrate examples of methods of manufacturing micro-electro-mechanical devices including microstructure bodies according to aspects of the present invention.

FIGS. 9A-1 to 9B-2 illustrate examples of methods of manufacturing micro-electro-mechanical devices including microstructure bodies according to aspects of the present invention.

FIGS. 12A and 12B illustrate a strain gauge to which a microstructure body according to one aspect of the present invention is applied.

DETAILED DESCRIPTION OF THE INVENTION

Hereinafter, embodiment modes of the present invention are described with reference to the accompanying drawings. However, the present invention is not limited to description below. This is because it is easily understood by those skilled in the art that a variety of changes may be made in modes and details without departing from the spirit and the scope of the present invention. Therefore, the present invention should not be construed as being limited to description of the embodiment modes given below.

Embodiment Mode 1

A microstructure body and a method of manufacturing the micro-electro-mechanical device of the present invention are described with reference to drawings.

Figures 1A, 1B:
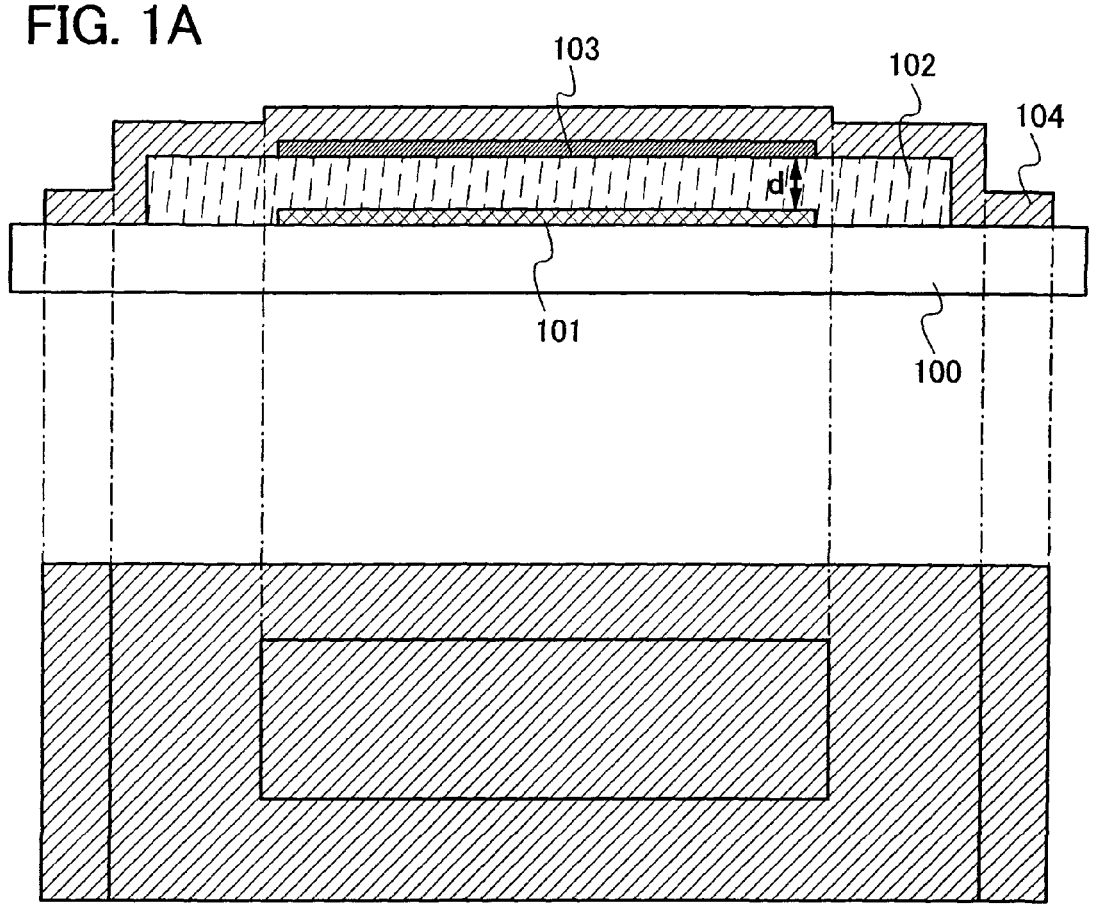
FIGS. 1A and 1B illustrate an example of a microstructure body according to one aspect of the present invention.

FIGS. 1A and 1B are, respectively, a cross-sectional view and a top view of an example of a microstructure body of the present invention. In the microstructure body of FIGS. 1A and 1B, a lower electrode layer 101 is provided over a substrate 100, and a filler material layer 102 is provided over the lower electrode layer 101. An upper electrode layer 103 is provided over the filler material layer 102, and a structure layer 104 is provided over the upper electrode layer 103. The distance between the lower electrode layer 101 and the upper electrode layer 103 is denoted by d (m).

The lower electrode layer 101 and the upper electrode layer 103 are isolated from each other by the filler material layer 102 to form a capacitor. Here, when it is assumed that the area of the lower electrode layer 101 is equal to the area of the upper electrode layer 103 and denoted by S ($m^2$), the capacitance of this capacitor is denoted by C (F), and the dielectric constant of the capacitor is denoted by $\in$ (F/m), an equation (1) below is obtained.

$$C = \frac{\varepsilon S}{d} \qquad \text{[Equation 1]}$$

Here, when the structure layer 104 is pressed down, the distance d between the lower electrode layer 101 and the upper electrode layer 103 is changed, whereby the capacitance is changed. The amount of change ΔC in capacitance at this time is represented by an equation (2) below using $C_0$ denoting the capacitance before the structure layer 104 is pressed down and $C_1$ denoting the capacitance after the structure layer 104 is pressed down.

$$\Delta C = C_1 - C_0 \qquad \text{[Equation 2]}$$

That is, when $d_0$ denotes the distance before the structure layer 104 is pressed down and $d_1$ denotes the distance after the structure layer 104 is pressed down, ΔC is represented by an equation (3) below.

$$\Delta C = \frac{\varepsilon S}{d_1} - \frac{\varepsilon S}{d_0} = \frac{\varepsilon S}{d_0 d_1}(d_0 - d_1) \qquad \text{[Equation 3]}$$

Thus, by finding out ΔC, the amount of change in the distance d between the lower electrode layer 101 and the upper electrode layer 103 is obtained.

Figures 2A, 2B:
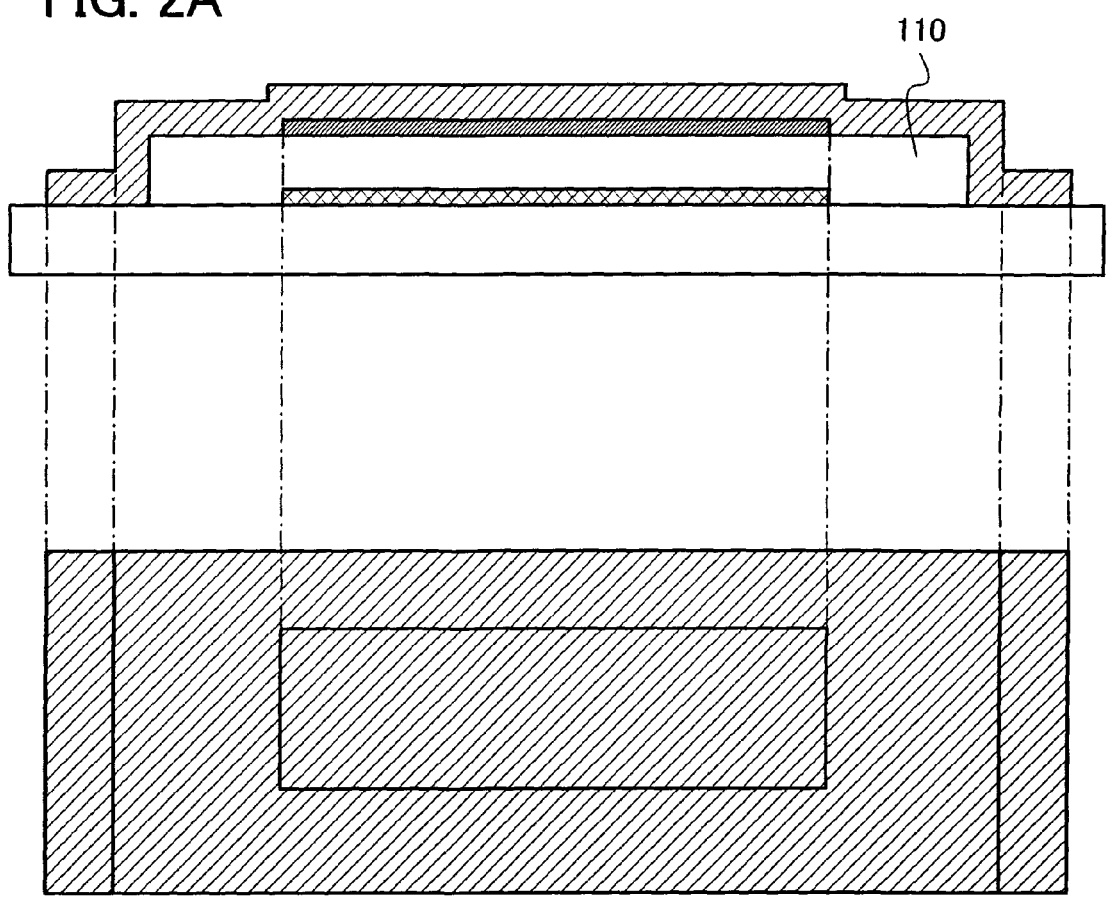
FIGS. 2A and 2B illustrate an example of a conventional microstructure body.

Note that FIGS. 2A and 2B illustrate an example of a conventional microstructure body. A portion of the filler material layer 102 in the microstructure body of FIGS. 1A and 1B corresponds to a hollow portion 110 in the microstructure body of FIGS. 2A and 2B.

Figure 3A:
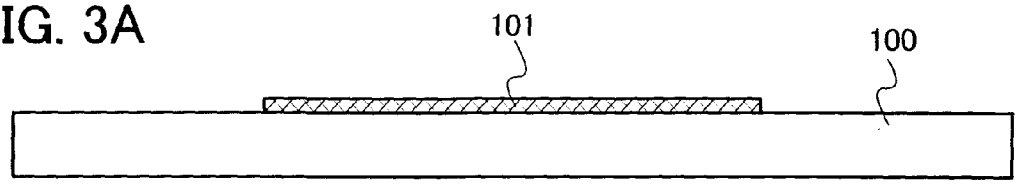
FIGS. 3A to 3G illustrate an example of a method of manufacturing a microstructure body according to one aspect of the present invention.

Next, an example of a method of manufacturing the microstructure body shown in FIGS. 1A and 1B is described with reference to drawings. First, the lower electrode layer 101 is selectively formed over the substrate 100 (see FIG. 3A).

There is no particular limitation on the substrate 100. Although, for example, a semiconductor substrate, a glass substrate, a quartz substrate, a plastic substrate, a stainless steel substrate, or the like can be used, an insulating substrate is preferably used. When a semiconductor substrate or a stainless steel substrate is used, an insulating film is preferably formed over this substrate to form an insulating surface.

For example, the lower electrode layer 101 can be formed as follows. A conductive film is formed over the substrate 100, a resist mask is formed over this conductive film by a photolithography method, and a desired portion of the conductive film is removed using this resist mask by etching or the like, so that the lower electrode layer 101 can be selectively formed. There is no particular limitation on a material for forming the lower electrode layer 101, and a material having conductivity may be used. As the material having conductivity, an element selected from tantalum, tungsten, titanium, molybdenum, aluminum, and copper; or an alloy material or a compound material containing any of these elements as the main component may be used. Alternatively, silicon to which an impurity element having one conductivity type is added or a transparent conductive film of indium tin oxide (ITO) or the like may be used. Note that there is no particular limitation on a formation method as well, and a sputtering method, a CVD method, a droplet discharging method, or the like can be used. By using a droplet discharging method, a desired pattern can be formed without etching, whereby the number of steps is reduced. Note that the lower electrode layer 101 may be a single layer or a stack of a plurality of layers.

Next, the filler material layer 102 is formed over the lower electrode layer 101. The filler material layer is formed of an organic material and thus difficult to pattern by etching using a resist mask. Therefore, the case where a metal film is used as a mask is described below.

Figure 3B:
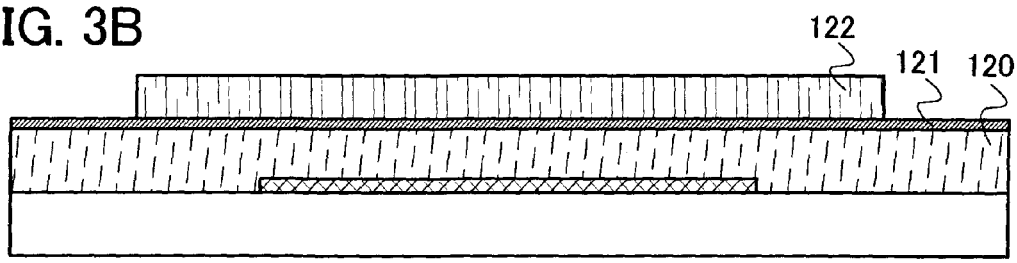

First, an organic film 120 is formed to cover the lower electrode layer 101; a metal film 121 is formed over the organic film 120; and a resist mask 122 is selectively formed over the metal film 121 (see FIG. 3B). The organic film 120 is formed using a material for forming the filler material layer 102 described later. For a formation method, a spin coating method or the like may be used, for example.

Figure 3C:
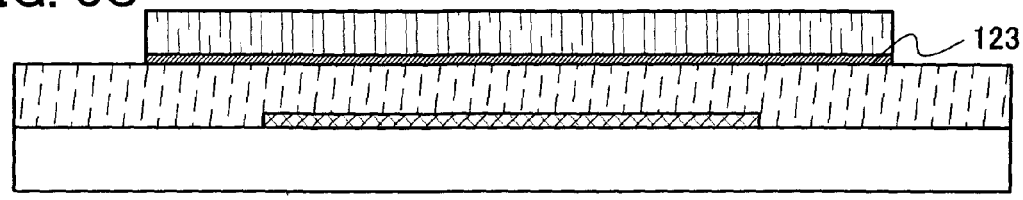

Next, the metal film 121 is etched using the resist mask 122, thereby forming a metal mask 123 (see FIG. 3C). For etching the metal film, a condition may be set depending on a material for the metal film. When the material for the metal film 121 is, for example, tungsten, dry etching in a chlorine gas atmosphere can be used. It is preferable to employ a condition providing high etching selectivity between the resist mask 122 and the organic film 120 (that is, a condition providing a high etching rate for the metal film 121 and a low etching rate for the organic film 120 and the resist mask 122). Thereafter, the resist mask 122 is removed.

Figure 3D:

Next, the organic film 120 is etched using the metal mask 123, thereby forming the filler material layer 102 (see FIG. 3D). For etching the organic film 120, dry etching may be performed using, for example, an oxygen gas. Thereafter, the metal mask 123 is removed. Note that the metal mask 123 is not necessarily removed and may be used as the upper electrode of the microstructure body.

Note that the example in which etching using a metal mask is employed for forming the filler material layer 102 is described above, the present invention is not necessarily limited to this example. For example, a pattern can also be formed by mixing a photosensitive material into the organic film 120 and performing light exposure.

Figure 3E:

As described above, the filler material layer 102 can be selectively formed over the lower electrode layer 101 (see FIG. 3E). The filler material layer 102 may be deformed depending on the movement of the microstructure body and therefore is formed of a material film that can withstand this deformation. After this material film is formed, a desired portion of the material film is removed by etching or the like in a similar manner to that of the lower electrode layer 101, so that the filler material layer 102 can be selectively formed. Alternatively, the filler material layer 102 may be selectively formed by a droplet discharging method.

As the material for the filler material layer 102 of the present invention, a porous material which can be deformed is used. It is preferable to use a material which can soften or harden by certain treatment (e.g., heat treatment or chemical solution treatment) after the formation. As such a material, a block copolymer or a graft copolymer that forms a microphase separation structure is given, for example.

The term "block copolymer" means a straight chain copolymer including a plurality of homopolymer chains as blocks linked together. For example, a diblock copolymer is given. Further, a block copolymer typified by a triblock copolymer, which includes more than three kinds of polymer chains linked together, may be used.

The term "graft copolymer" means a copolymer having a structure in which other polymer chains as side chains are linked to the main chain of the polymer. The polymer chains linked as side chains may be of different kinds.

Note that for the material forming the filler material layer 102, a block copolymer is preferably used. This is because with a block copolymer, a polymer with a narrow molecular weight distribution can be readily obtained and a composition ratio can be relatively easily controlled. By controlling the composition ratio of the material for the filler material layer 102, the volume occupied by a pore per unit volume of the filler material layer 102 can be controlled. Thus, the amount of deformation of the filler material layer 102 for unit load can be varied. Hereinafter, a block copolymer which can be applied to the present invention is described.

Figure 4A:
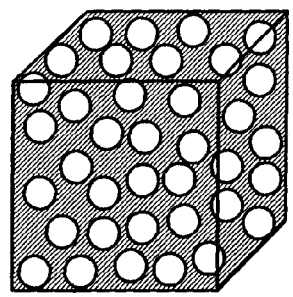
FIGS. 4A to 4G each illustrate a phase of a block copolymer applicable to the present invention.
Figure 4D:
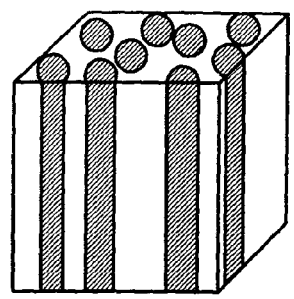
Figure 4B:
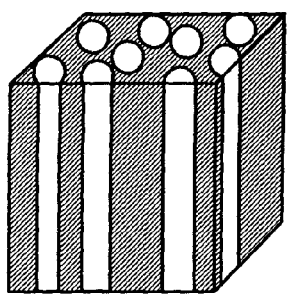
Figure 4E:
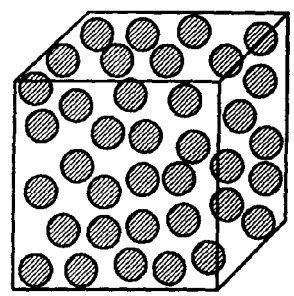
Figure 4C:
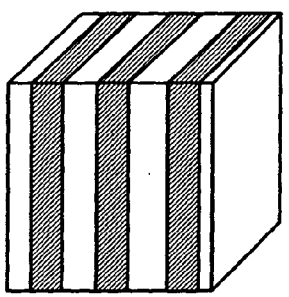
Figure 4F:
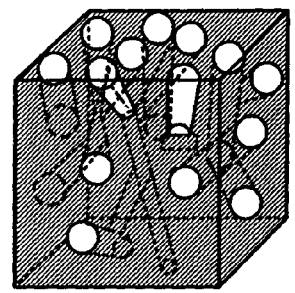
Figure 4G:
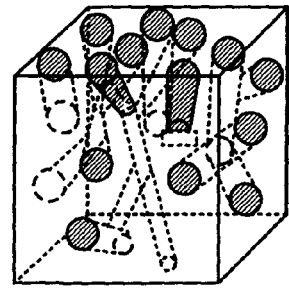

It is known that a block copolymer spontaneously forms a nanometer-scale microphase separation structure. For example, an AB block copolymer is microphase-separated to form a periodic structure such as a spherical structure, a cylinder structure, a gyroid structure, or a lamellar structure depending on the composition ratio of high molecule included in the block copolymer. Note that when the rate of one of the components is less than or equal to approximately 20%, a spherical structure is formed (see FIG. 4A or 4E); when the rate is greater than or equal to approximately 20% and less than or equal to approximately 35%, a cylinder structure is formed (see FIG. 4B or 4D); when the rate is greater than or equal to approximately 35% and less than or equal to approximately 40%, a gyroid structure is formed (see FIG. 4F or 4G), and when the rate is greater than or equal to approximately 40%, a lamellar structure is formed (see FIG. 4C). Note that a chemical solution does not easily reach a surface of the filler material layer in wet etching and thus one of the components which should be removed is difficult to remove in the case of a spherical structure and therefore a cylinder structure, a gyroid structure, or a lamellar structure is preferably employed.

For production of a block copolymer, a living polymerization method can be used, for example. The living polymerization method refers to a method by which polymerization of one kind of monomer is initiated by a polymerization initiator that generates anions or cations and another monomer is sequentially added for synthesis, so that a block copolymer is produced. The production method is described below.

First, components of a block copolymer are dissolved in a solvent. This solvent is preferably a good solvent for all the plural kinds of polymers included in the block copolymer. Here, the term "good solvent" means a solvent that can produce a homogeneous solution of the polymers included in the block copolymer. Because two kinds of polymers are used here, a homogeneous solution of the two kinds of polymers may be produced. For example, a toluene solution of about 5% by weight of the block copolymer is applied to a region where the filler material layer 102 is to be formed by a spin coating method or the like. Note that although a solution is applied to the entire surface of a substrate in a spin coating method, a solution is applied to only a desired region by using a droplet discharging method, for example, whereby a later process is simplified and further utilization efficiency of a material is improved; thus, use of such droplet discharging method or the like is preferable.

Next, heat treatment is performed on the substrate to which the above solution is applied, thereby inducing microphase separation. A temperature during the heat treatment is set to greater than or equal to the glass transition point of the components included in the block copolymer and less than or equal to the phase transition temperature thereof.

Note that there is a variety of kinds of block copolymers, typically, a styrene-butadiene AB block copolymer and a styrene-isoprene AB block copolymer. Besides, there is a block copolymer made up of different materials, such as polymethylmethacrylate (PMMA); a block copolymer obtained by attaching a modifying group to a terminal group of a styrene-isoprene block copolymer; and the like. Examples of a high molecular segment of the block copolymer include hydrophobic aromatic hydrocarbon chains such as polystyrene and polyfluorene, hydrophobic aliphatic unsaturation hydrocarbon chains such as polybutadiene and polyisoprene, hydrophilic aliphatic hydrocarbon chains such as polyvinyl alcohol and polyethylene glycol, hydrophilic aromatic hydrocarbon chains such as polyvinyl pyridine and polystyrene sulfonic acid, hydrophobic siloxanes such as poly dimethylsiloxane, metal complexes such as poly ferrocene, and the like. Further, the block copolymer is linear, branched, or cyclic by covalent bond of two or more kinds of these high molecular segments at one or more bonding points.

The above material may further contain a solvent. Examples of the solvent include aliphatic hydrocarbons such as hexane, heptane, and octane; halogenated hydrocarbons such as carbon tetrachloride, chloroform, and dichloromethane; aromatic hydrocarbons such as benzene, toluene, and xylene; ketones such as acetone and methyl ethyl ketone; ethers such as dimethyl ether and diethyl ether; alcohols such as methanol and ethanol; water; and the like. The solvent can be selected among these solvents depending on properties or conditions of a material which is to be formed.

In this embodiment mode, the filler material layer can be formed and selective removal of one of the components of a block copolymer by etching is achieved. Further, an ABA block copolymer or a BAB block copolymer can also have any of a variety of structures such as a spherical structure and a lamellar structure according to the composition of the block copolymer. Note that in the present invention, it is preferable to employ a cylinder structure, a gyroid structure, or a lamellar structure, as described above.

Note that in this embodiment mode, a material which can be applied to the filler material layer 102 is not limited to the materials described above and may be a material made of plural kinds of substances, in which one kind of substance can be removed by etching or the like in a later step. Further, although the substance removed by etching or the like is not necessarily one kind of substance, it is necessary at the very least that at least one kind of substance in the filler material layer 102 be not removed by etching or the like to remain. Further, heat resistance and chemical resistance are needed such that the material can withstand a process after the formation. Here, the substance remaining in the filler material layer 102 without being removed is preferably capable of elastic deformation.

Figure 3F:
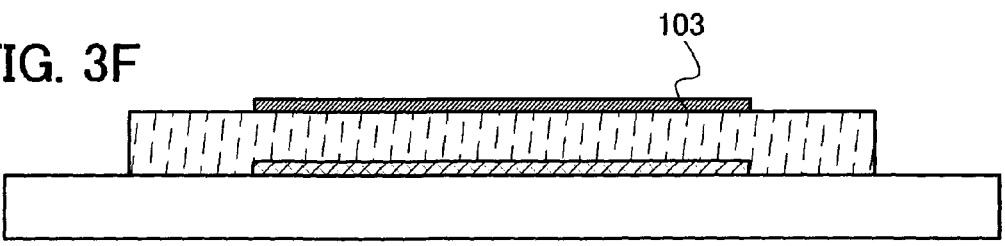

Next, the upper electrode layer 103 is formed over the filler material layer 102 (see FIG. 3F). The upper electrode (second electrode) is formed to face the lower electrode (first electrode). The upper electrode layer 103 may be formed using a material and a method which are similar to those of the lower electrode layer 101. That is, a conductive film may be formed over the entire surface, and then a desired portion of the conductive film may be removed by etching or the like.

Figure 3G:
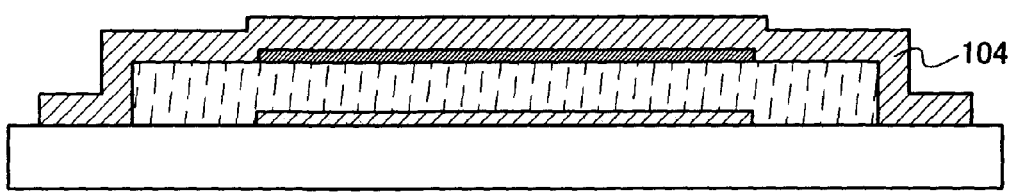

Next, the structure layer 104 is selectively formed over the upper electrode layer 103 so as to cover the filler material layer 102 (see FIG. 3G). For forming the structure layer 104, in a similar manner to that of the first electrode layer and the like, a material film may be formed over the entire surface, and then a desired portion of this material film may be removed by etching.

A material for the structure layer 104 is not limited to a particular material as long as the material has some toughness. For example, a silicon oxynitride film, a silicon nitride film, or the like can be used. Here, although a silicon oxynitride film or a silicon nitride film may be formed by a CVD method or the like, there is no particular limitation on a formation method as well.

Note that an opening portion may be formed in the structure layer 104 such that one of the materials contained in the filler material layer 102 is removed by etching or the like. Furthermore, an opening portion may also be formed in the upper electrode layer 103; however, the opening portion is not formed in the case where etching is performed before the upper electrode layer 103 is formed. Note that the number of the opening portion is not necessarily limited to one and that a minute opening portion is preferably formed in any portion of the filler material layer 102. Hereinafter, the case where a block copolymer is used for the filler material layer 102 is described.

In order to remove one of the components of the block copolymer, dry etching or wet etching can be used. For example, a reactive ion etching (RIE) method in an oxygen gas atmosphere can be used. It is preferable to adopt a condition in which etching rates of a component which should be removed and a component to remain in the block copolymer are greatly different from each other. In general, the higher the content of carbon molecules per unit molecule contained in a polymer molecular chain is, the higher etching tolerance is; the lower the content of oxygen molecules per segment is, the lower etching tolerance is. For example, because polystyrene (PS) contains an aromatic ring, the content of carbon molecules in a block copolymer of polystyrene-polymethylmethacrylate (PS-PMMA) is high; thus, the etching tolerance of the block copolymer is high. The etching tolerance of polyacrylamide (PAAM) is low since the content of oxygen molecules is high. In the case of using an RIE method, the etching rate of one of these two kinds of components is generally four times that of the other.

Note that a gas used for the etching is not limited to an oxygen gas and may be $CF_4$, $H_2$, $C_2F_6$, $CHF_3$, $CH_2F_2$, $CF_3Br$, $NF_3$, $Cl_2$, $CCl_4$, HBr, $SF_6$ or the like.

Note that etching rate is determined per monomer unit of a block copolymer. It is known that when N denotes the total number of atoms per monomer unit, Nc denotes the number of carbon atoms per monomer unit, and No denotes the number of oxygen atoms per monomer unit, etching rate is proportional to N/(Nc−No).

However, in the above dry etching method, although there is no problem in the case of a cylinder structure or the like, many portions could fail to be etched in the case of a spherical structure. Thus, in the case of a spherical structure, a wet etching method is preferably used. By a wet etching method, one of the components can be etched according to the material for a formed block copolymer and the other of the components may be etched under a condition of high etching tolerance. However, in consideration of the above circumstances, it is more preferable to employ a cylinder structure, a gyroid structure, or a lamellar structure.

Further, a method of removing the component which should be removed is not necessarily limited to etching. If possible, the component which should be removed may be removed by vaporization, sublimation, or the like by heat treatment or the like.

As described above, the microstructure body of the present invention can be formed. In the microstructure body of the present invention, unlike a conventional microstructure body, the hollow portion is filled with a material that can be deformed. Accordingly, a microstructure body having mechanical strength higher than a conventional microstructure body including a hollow portion can be manufactured. The improvement in mechanical strength makes it possible to prevent generation of a defect during a manufacturing process or operation to improve yield and reliability.

Further, since the microstructure body of the present invention has no hollow portion, a sacrificial layer is not needed to be formed. Thus, a step of forming a sacrificial layer and a step of removing it are not needed, whereby the number of manufacturing steps can be reduced. Further, in manufacture of a conventional microstructure body, when a sacrificial layer is not sufficiently removed by etching, yield may be reduced by a remaining portion of the sacrificial layer. By applying the present invention, such a reduction in yield due to a remaining portion of a sacrificial layer can be prevented, whereby yield improves.

Further, when a strain gauge is formed of the upper electrode layer 103 and the structure layer 104 in the microstructure body, the lower electrode layer 101 is not necessarily formed. Furthermore, the present invention can be applied not only to a sensor but also to an actuator.

Alternatively, by applying bimetal to the structure layer 104, an actuator that drives by a bimetal effect can be manufactured.

By using such a microstructure body, a dynamic sensor can be manufactured. With this dynamic sensor, a pressure sensor can be manufactured, for example. Further, with the above actuator, a display device or the like using an interference method can be manufactured.

Figure 11A:
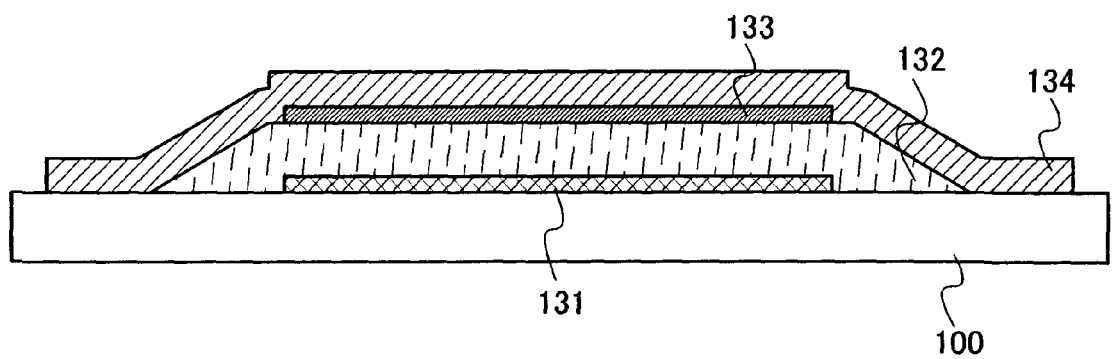
FIGS. 11A and 11B each illustrate an example of a microstructure body according to one aspect of the present invention.

Further, although the case is described in the above description in which the side face of the filler material layer does not have a tapered shape, the present invention is not limited to this case, and the side face of the filler material layer may have a tapered shape (see FIG. 11A). In the microstructure body shown in FIG. 11A, a lower electrode layer 131 is provided over the substrate 100, and a filler material layer 132 is provided to cover the lower electrode layer 131. An upper electrode layer 133 is provided over the filler material layer 132, and a structure layer 134 is provided over the upper electrode layer 133. A side face of the filler material layer 132 is processed to have a tapered shape. With the side face of the filler material layer 132 having a tapered shape, the structure layer and the like formed over this filler material layer 132 can be formed in an excellent manner. Accordingly, disconnection of a wiring electrically connected to the lower electrode layer 131 and the upper electrode layer 133 of the microstructure body can be prevented, whereby yield in the manufacturing process improves.

Figure 11B:
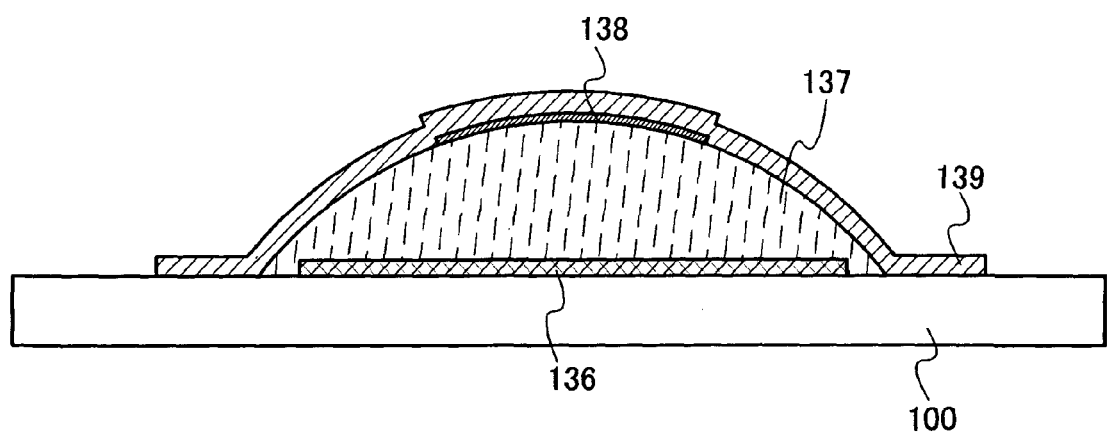

Furthermore, the filler material layer of the present invention can also be formed by a droplet discharging method (see FIG. 11B). In the microstructure body shown in FIG. 11B, a lower electrode layer 136 is provided over the substrate 100, and a filler material layer 137 is provided to cover the lower electrode layer 136. An upper electrode layer 138 is provided over the filler material layer 137, and a structure layer 139 is provided over the upper electrode layer 138. The filler material layer 137 formed by a droplet discharging method is formed to have a curved shape. That is, a surface of the filler material layer may be formed so as to be curved.

As described above, the present invention is not limited to one mode and can be applied to microstructure bodies having a variety of structures. By providing a filler material layer in a space corresponding to a hollow portion in a conventional microstructure body, a manufacture microstructure body including a movable portion with high mechanical strength and high reliability can be manufactured with high yield.

Note that only the simplest example is described in this embodiment mode and that a variety of modes can be implemented depending on a function of a microstructure body.

Embodiment Mode 2

In this embodiment mode, an example of a structure of a semiconductor device of the present invention and a manufacturing method of the semiconductor device are described with reference to drawings.

A semiconductor device of the present invention belongs to a field of a micromachine and generally ranges in size from micrometers to millimeters. Further, the semiconductor device may be in meters for ease of assembling when manufactured to be incorporated as a component of a certain mechanical device.

Figure 5:
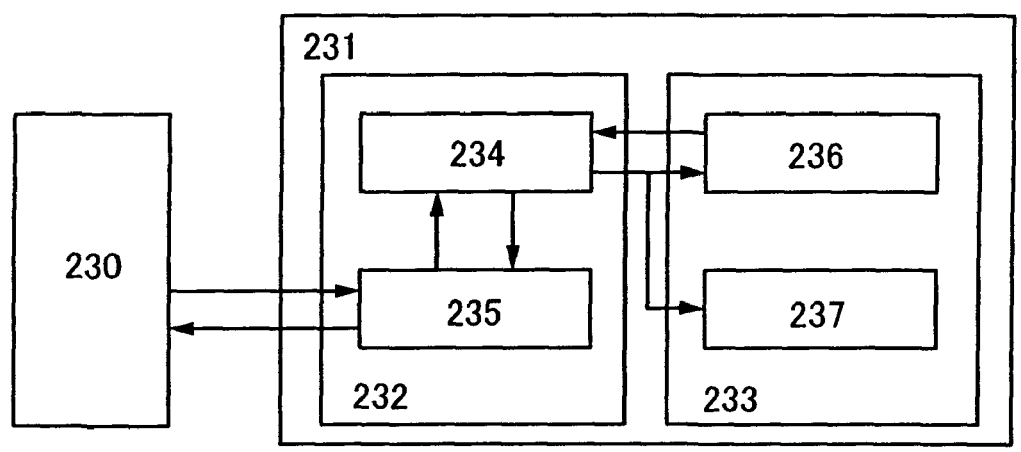
FIG. 5 is a block diagram illustrating an example of a micro-electro-mechanical device including a microstructure body according to one aspect of the present invention.

FIG. 5 is a block diagram of an example of the semiconductor device of the present invention. The semiconductor device 231 of the present invention includes an electric circuit portion 232 and a structure portion 233. The electric circuit portion 232 is formed using a semiconductor element and includes a control circuit 234 for controlling the structure portion 233 and an interface 235 for communicating with an external control device 230. Further, the structure portion 233 includes a sensor 236, an actuator 237, a switch, and the like formed using a microstructure body. The structure portion 233 may include one of a sensor, an actuator, and a switch.

Further, the electric circuit portion 232 may include a central processing unit for processing data obtained by the structure body portion 233, a memory for storing processed data, and the like.

The external control device 230 performs operation, such as transmission of signals for controlling the semiconductor device 231, reception of data obtained by the semiconductor device 231, or supply of driving power to the semiconductor device 231.

Note that the present invention is not limited only to the above structure example. That is, the semiconductor device of the present invention may include an electric circuit for controlling a microstructure body and the microstructure body controlled by the electric circuit, and other structures of the semiconductor device are not limited to those in FIG. 5.

Next, in order to manufacture the above-described semiconductor device of the present invention, a method of forming a microstructure body and a semiconductor element over one substrate is described with reference to FIGS. 6A-1 to 6C-2, FIGS. 7A-1 to 7B-2, and FIGS. 8A-1 to 8B. Each drawing is a top view or a cross-sectional view taken along a line O-P in the top view.

The microstructure body of the present invention and the semiconductor element can be formed over a substrate having one insulating surface (hereinafter referred to as an insulating substrate). Here, as the insulating substrate, there are a glass substrate, a quartz substrate, a plastic substrate, and the like. Alternatively, a conductive substrate of metal or the like, or a semiconductor substrate of silicon or the like, over which a layer having an insulating property is formed, may be used. By forming the microstructure body and the semiconductor element over one plastic substrate, a highly flexible and thin semiconductor device can be manufactured. Further, by thinning a glass substrate by grinding or the like, a thin semiconductor device can also be manufactured.

In the semiconductor device of the present invention, the microstructure body includes a filler material layer. The filler material layer is preferably formed of a block copolymer, as described in Embodiment Mode 1. However, since a block copolymer does not have high heat resistance enough to withstand a manufacturing process of a thin film transistor in many cases, a manufacturing method in which a thin film transistor is formed first over a substrate and then the microstructure body is formed is described in this embodiment mode.

First, a base film 202 is formed over an insulating substrate 201. The base film 202 is formed of a single layer or stacked layers of an insulating film such as a silicon oxide based material film or a silicon nitride based material. Here, the case is described in which an insulating film having a two-layer structure is formed as the base film 202. Note that the base film 202 is not necessarily provided if not necessary.

Note that the silicon oxide based material corresponds to silicon oxide containing oxygen and silicon as the main components, or silicon oxynitride which is silicon oxide containing nitrogen, in which the content of oxygen is higher than that of nitrogen. The silicon nitride based material corresponds to silicon nitride containing nitrogen and silicon as the main components, or silicon nitride oxide which is silicon nitride containing oxygen, in which the content of nitrogen is higher than that of oxygen.

In this embodiment mode, the base film 202 has a two-layer structure. As a first layer of the base film 202, for example, a silicon nitride based material film is formed to a thickness greater than or equal to 10 nm and less than or equal to 200 nm, preferably, greater than or equal to 50 nm and less than or equal to 100 nm, using $SiH_4$, $NH_3$, $N_2O$, and $H_2$ as reaction gases by a plasma CVD method. Here, a silicon nitride oxide film with a thickness of 50 nm is formed. Next, as a second layer of the base film 202, a silicon oxide based material film is formed over the first layer to a thickness greater than or equal to 100 nm and less than or equal to 150 nm using $SiH_4$ and $N_2O$ as reaction gases by a plasma CVD method. Here, a silicon oxynitride film with a thickness of 100 nm is formed.

Figure 6A:
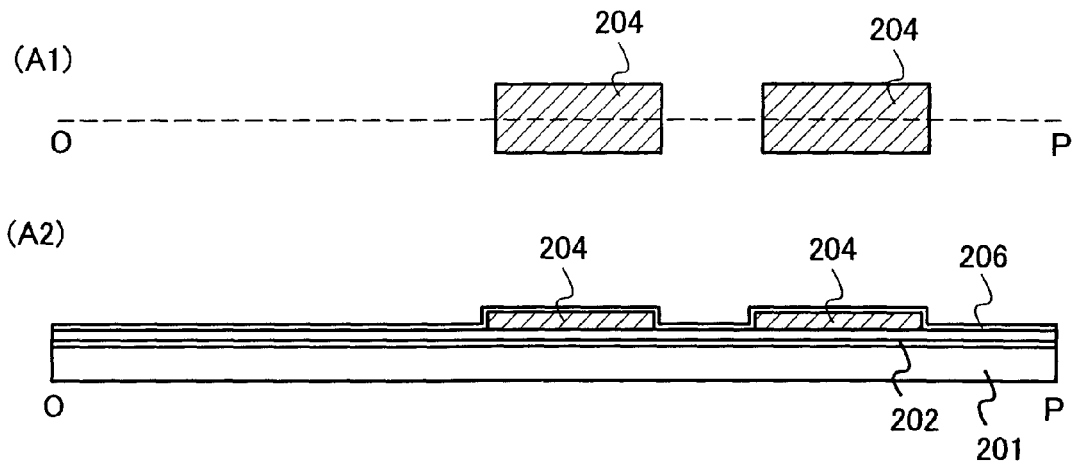

Next, a semiconductor film is formed to be etched to have a certain shape, thereby forming a semiconductor layer 204 (see FIGS. 6A-1 and 6A-2). The semiconductor layer 204 can be formed of a material containing silicon as the main component. As a material containing silicon, there is a material made of silicon, a silicon germanium material containing germanium at about 0.01 to 4.5 atomic %, and the like.

For the semiconductor layer 204, a material having a crystalline structure or an amorphous structure can be used. Here, an amorphous semiconductor film is formed to be crystallized by heat treatment, thereby forming a crystalline semiconductor film. For the heat treatment, heating using a heating furnace, laser irradiation, irradiation with light emitted from a lamp instead of laser light (hereinafter referred to as lamp annealing), or a combination of any of the above can be used.

In the case of laser irradiation, continuous wave laser light (CW laser light) or pulsed wave laser light (pulsed laser light) can be used. As the laser light, laser light emitted from one or a plurality of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser can be used. By irradiation with the fundamental waves of such laser light or the second harmonic to the fourth harmonic laser light of these fundamental waves, crystals with a large grain size can be obtained. For example, a second harmonic (532 nm) or a third harmonic (355 nm) of an Nd:$YVO_4$ laser (a fundamental wave of 1064 nm) can be used. The energy density of the laser light in this case is set to approximately greater than or equal to 0.01 MW/cm$^2$ and less than or equal to 100 MW/cm$^2$, preferably, greater than or equal to 0.1 MW/cm$^2$ and less than or equal to 10 MW/cm$^2$. Then, irradiation is conducted at a scanning rate of approximately greater than or equal to 10 cm/sec and less than or equal to 2000 cm/sec.

Note that the laser crystallization may be performed by irradiation with continuous wave laser light of a fundamental wave and continuous wave laser light of a harmonic or irradiation with continuous wave laser light of a fundamental wave and pulse-oscillation laser light of a harmonic.

Further, it is also possible to use pulsed laser light oscillated at a repetition rate that allows laser light of a next pulse to be delivered before the semiconductor layer is solidified and after the semiconductor layer is melted by previous laser light. By using laser light with such a repetition rate, crystal grains that are grown continuously in the scan direction can be obtained. As a specific repetition rate of the laser light, a repetition rate greater than or equal to 10 MHz is used. This is much higher than the normally used frequency band ranging from several tens of Hz to several hundred Hz.

Alternatively, the heat treatment may be performed by other methods instead of the laser irradiation. For example, the heat treatment using a heating furnace can be performed. In the case of using a heating furnace, the amorphous semiconductor film may be heated at a temperature greater than or equal to 400° C. and less than or equal to 550° C. for greater than or equal to 2 hours and less than or equal to 20 hours. At this time, the temperature may be set at many steps in the range of greater than or equal to 400° C. and less than or equal to 550° C. so as to increase gradually. In the case of setting at many steps, with a temperature of about 400° C. at a first step, hydrogen etc. contained in the amorphous semiconductor film is discharged. Accordingly, surface roughness of the film in the crystallization can be reduced, or removal of the film in the crystallization can be prevented. Furthermore, by using a metal promoting crystallization, for example, nickel, crystallization at a relatively low temperature can be realized. As the metal promoting crystallization, instead of nickel, a metal such as Fe, Ru, Rh, Pd, Os, Ir, Pt, Cu, or Au can be used alternatively.

Further alternatively, both the heat treatment using a heating furnace and the heat treatment using a laser may be used in combination for the crystallization of the amorphous semiconductor film.

Note that the metal promoting crystallization may be a contaminant for the semiconductor device and therefore is preferably removed or reduced after the crystallization. In this case, after the crystallization by the heat treatment using a heating furnace or using laser irradiation, a layer serving as a gettering sink is formed over the semiconductor layer and heated, so that the metal is moved into the gettering sink, whereby the metal can be removed or reduced. As the gettering sink, a polycrystalline semiconductor film or a semiconductor film to which an impurity element is added can be used. For example, a polycrystalline semiconductor film to which an inert element such as argon is added is formed over the semiconductor film, and can be used as the gettering sink. Addition of an inert element allows the polycrystalline semiconductor film to have a distortion, thereby capturing the metal effectively. Alternatively, the metal can be captured by forming a semiconductor film to which an element such as phosphorus is added.

Further, the semiconductor layer 204 is not limited to an amorphous semiconductor film or a film obtained by crystallizing an amorphous semiconductor film. For example, a single crystal semiconductor layer formed by bonding a semiconductor substrate provided with a damaged layer formed by doping hydrogen ions or the like to the insulating substrate 201 or the insulating substrate 201 provided with an insulating film thereon and separating the semiconductor layer from the damaged layer may be used. Note that here, an insulating film may also be provided on the bonding surface of the semiconductor substrate. A semiconductor layer formed by such a process can exhibit excellent electrical properties (e.g., high mobility), and accordingly a high-performance semiconductor device using a microstructure body of the present invention can be provided. For example, power consumption is reduced. Besides, an area covered by the electric circuit portion 232 in FIG. 5 can be reduced.

Next, a gate insulating film 206 is formed over the semiconductor layer 204 (see FIGS. 6A-1 and 6A-2). In a similar manner to that of the base film 202, the gate insulating film 206 is formed using a silicon oxide based material, a silicon nitride based material, or the like by a plasma CVD method, a sputtering method, or the like. In this embodiment mode, as the gate insulating film 206, a silicon oxynitride film having a thickness of 110 nm is formed by a plasma CVD method. Naturally, the gate insulating film 206 is not limited to a silicon oxynitride film, and another insulating film containing silicon may be formed to have a single layer or stacked layers.

Alternatively, the gate insulating film 206 can also be formed by a high-density plasma treatment. Here, the term "high-density plasma treatment" means plasma treatment in which a plasma density is greater than or equal to $1\times10^{11}$ cm$^{-3}$, preferably, greater than or equal to $1\times10^{11}$ cm$^{-3}$ and less than or equal to $9\times10^{15}$ cm$^{-3}$ and a high frequency wave such as a microwave (e.g., a frequency of 2.45 GHz) is used. When plasma is produced under such conditions, a low electron temperature is greater than or equal to 0.2 eV and less than or equal to 2.0 eV. Thus, such high-density plasma at a low electron temperature has low kinetic energy of active species and makes it possible to form a film with less plasma damage and fewer defects. In the insulating film formed by the high-density plasma treatment in this manner, the state of an interface between this insulating film and the layer in contact with the insulating film can be improved. Thus, when the gate insulating film 206 is formed by high-density plasma treatment, the state of an interface between the gate insulating film 206 and the semiconductor layer 204 can be improved. Accordingly, electrical properties of the semiconductor element can be improved.

Furthermore, the high-density plasma treatment can be used for forming not only the gate insulating film 206 but also the base film 202 or other insulating layers.

Figure 6B:
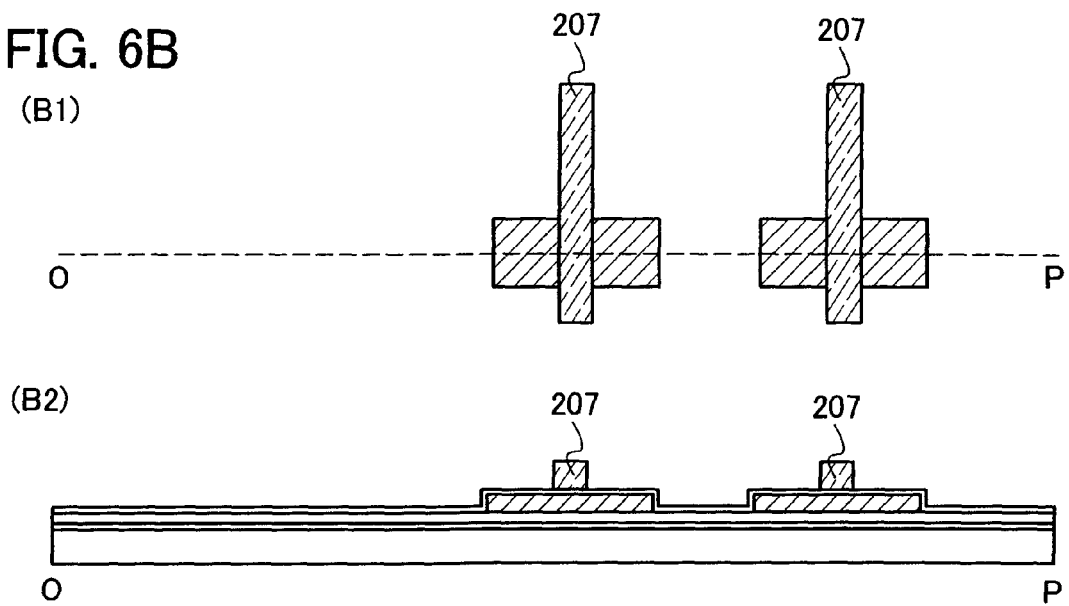

Next, a conductive film serving as a gate electrode layer 207 included in the semiconductor element is formed over the gate insulating film 206 and is, for example, etched to have a desired shape (see FIGS. 6B-1 and 6B-2). The gate electrode layer 207 can be formed using a metal having conductivity, such as tungsten, a compound having conductivity, or the like, by a sputtering method, a CVD method, or the like. Note that the gate electrode layer 207 may be formed of a stack of two or more kinds of conductive materials. Further, a side face may be etched to have a tapered shape. Note that a tungsten film is formed to have a single layer, thereby forming the gate electrode layer.

A pattern for obtaining a desired shape is formed by forming a resist mask using a photolithography method and performing anisotropic dry etching. As an etching method, an inductively coupled plasma (ICP) etching method can be used, for example. Etching conditions (the amount of power applied to a coiled electrode, the amount of power applied to an electrode on the insulating substrate 201 side, a temperature of the electrode on the insulating substrate 201 side, etc.) may be determined in consideration of the thickness of a film which is to be etched. Note that as an etching gas, a chlorine-based gas such as $Cl_2$, $BCl_3$, $SiCl_4$, or $CCl_4$; a fluorine-based gas such as $CF_4$, $SF_6$, or $NF_3$; or an $O_2$ gas can be used.

Figure 6C:
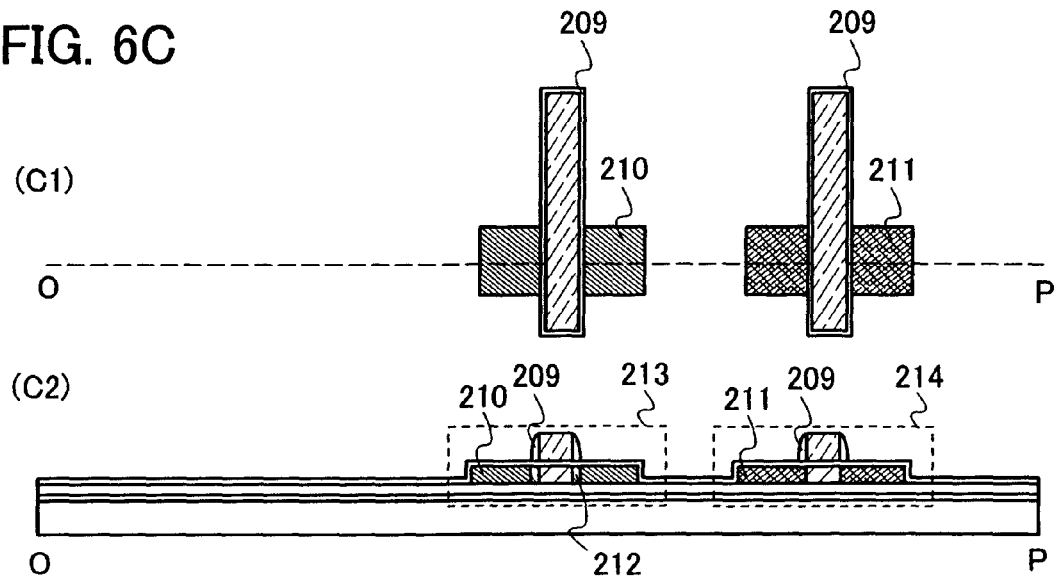

Next, impurity elements are added to predetermined regions of the semiconductor layer 204 to form a p-type impurity region 211 and an n-type impurity region 212 (see FIGS. 6C-1 and 6C-2). These impurity regions can be selectively formed by forming a resist mask by a photolithography method and adding the impurity elements. As a method for adding the impurity elements, an ion doping method or an ion implantation method can be employed. As an impurity element imparting n-type conductivity, phosphorus (P) or arsenic (As) can be typically used, and as an impurity element imparting p-type conductivity, boron (B) can be used.

Next, an insulating film made of a silicon nitride based material or a silicon oxide based material is formed by a plasma CVD method or the like to be etched anisotropically in a perpendicular direction, thereby forming an insulating layer (hereinafter referred to as a sidewall 209) in contact with a side face of the gate electrode layer 207 (see FIGS. 6C-1 and 6C-2).

Next, an impurity element is further added to the semiconductor layer 204 having the n-type impurity region 212 to form a high-concentration n-type impurity region 210 having an impurity concentration higher than that of the n-type impurity region 212 provided below the sidewall 209.

Further, when the gate electrode layer 207 is formed of a stack of different conductive materials and has a tapered-shaped side face, the sidewall 209 is not necessarily formed. This is because when the gate electrode layer 207 has a tapered-shaped side face, the n-type impurity region 212 and the high-concentration n-type impurity region 210 can be formed by adding an impurity element at a time.

Note that by forming the n-type impurity region 212 and the high-concentration n-type impurity region 210 as described above, the thin film transistor can have a lightly doped drain (LDD) structure. By forming the thin film transistor having an LDD structure, a short channel effect can be prevented. The smaller the thin film transistor is, the more easily a short channel effect occurs; thus, the smaller the thin film transistor is, the more preferably an LDD structure is employed. Note that only the n-type semiconductor element may have an LDD structure.

Next, after the impurity regions are formed, in order to activate the impurity elements, heating or irradiation with infrared light or laser light is performed. Further, at the same time as the activation, it is possible to recover plasma damage of the gate insulating film 206 or plasma damage of the interface between the insulating film 206 and the semiconductor layer 204. In particular, the impurity elements can be effectively activated by using an excimer laser from the front or rear surface of the substrate 201 in an atmosphere at room temperature to 300° C. Further, a second harmonic of a YAG laser may be used for the activation. A YAG laser is preferably used as a laser irradiation means because maintenance of the YAG laser is not so frequently required.

Further, a passivation film made of an insulating material such as silicon oxynitride or silicon oxide may be formed so as to cover the semiconductor layer 204 and the conductive layer which serves as the gate electrode layer 207. After the passivation film is formed, heating, infrared light irradiation, or laser light irradiation can be further performed for hydrogenation. For example, a silicon oxynitride film is formed to a thickness of 100 nm by a plasma CVD method, and then heating is performed using a clean oven at 300 to 550° C. for 1 to 12 hours, thereby hydrogenating the semiconductor layer 204. For example, heating is performed using a clean oven in a nitrogen atmosphere at 410° C. for one hour. In this step, hydrogen is contained in the passivation film to terminate dangling bonds in the semiconductor layer 204, which is caused by the addition of the impurity element. Further, at the same time, the above-described activation treatment of the impurity region can be carried out.

Through the above-described steps, an n-type semiconductor element 213 and a p-type semiconductor element 214 which are thin film transistors are formed (see FIGS. 6C-1 and 6C-2).

Subsequently, an interlayer insulating layer 215 is formed so as to cover the whole semiconductor element (see FIGS. 7A-1 and 7A-2). The interlayer insulating layer 215 can be formed of an inorganic or organic material or the like having an insulating property. As the inorganic material, silicon oxide, silicon nitride, or the like can be used. As the organic material, polyimide, acrylic, polyamide, polyimide-amide, benzocyclobutene, a siloxane resin, or polysilazane can be used. Note that a siloxane resin corresponds to a resin containing a Si—O—Si bond. Siloxane has a skeleton structure with a silicon-oxygen bond. As a substituent, an organic group (e.g., an alkyl group or an aromatic hydrocarbon) or a fluoro group may be used. The organic group may contain a fluoro group. Polysilazane is formed using a polymer material having a silicon-nitrogen bond as a starting material.

Note that when the interlayer insulating layer 215 is formed of the inorganic material by a CVD method or the like, after being formed, the interlayer insulating layer 215 is preferably planarized by a chemical mechanical polishing (CMP) method or the like.

Next, the interlayer insulating layer 215 and the gate insulating film 206 are sequentially etched to form a contact hole. As the etching, a dry etching method or a wet etching method can be employed. In this embodiment mode, the contact hole is formed by a dry etching method.

Next, a conductive layer 217 is formed over the interlayer insulating layer 215 and in the contact hole to be, for example, etched to have a desired shape, thereby forming a wiring for forming a source or drain electrode layer and further the electric circuit (see FIGS. 7A-1 and 7A-2). The conductive layer 217 can be formed using a film containing an element such as aluminum, titanium, molybdenum, tungsten, or silicon, or an alloy film using any of these elements.

Further, when the conductive layer 217 is rectangular because of a layout limitation and thus has a pattern with a corner portion, the corner portion is preferably, for example, etched to have a round shape. By the etching forming a round shape, generation of dust during a manufacturing process can be suppressed, whereby yield can be improved. This applies to the gate electrode layer, the semiconductor layer, and the like.

Through the above-described steps, the thin film transistors, the interlayer insulating layer 215 covering the thin film transistors, and the conductive layer 217 serving as the wiring connected to the thin film transistors can be formed.

Next, the microstructure body is provided over the interlayer insulating layer 215. The process described in Embodiment Mode 1 may be applied to a method of manufacturing the microstructure body.

Note that here, the case is described in which the conductive layer 217 serves as the source or drain electrode layer of the thin film transistor and the lower electrode of the microstructure body. Therefore, the lower electrode of the microstructure body has already been formed by the above process. However, the present invention is not limited to this case, and the conductive layer 217 and the lower electrode of the microstructure body may be formed separately.

Next, a filler material layer 218 is formed to cover the lower electrode formed of the conductive layer 217. The filler material layer 218 may be formed using a material and a method which are similar to those of the filler material layer 102 in Embodiment Mode 1.

Next, a conductive layer 219 for forming an upper electrode is formed over the filler material layer 218 which is formed to have a desired pattern, and a structure layer 220 is formed over the conductive layer 219 which is formed to have a desired pattern. The conductive layer 219 may be formed using a material and a method which are similar to those of the upper electrode layer 103 in Embodiment Mode 1, and the structure layer 220 may be formed using a material and a method which are similar to those of the structure layer 104 in Embodiment Mode 1.

As described above, it is possible to form the microstructure body of the present invention and the transistor over one substrate (see FIGS. 8A-1 and 8A-2).

Note that the conductive layer 217 may form the upper electrode, not the lower electrode of the microstructure body (see FIG. 8B).

Figure 10A:
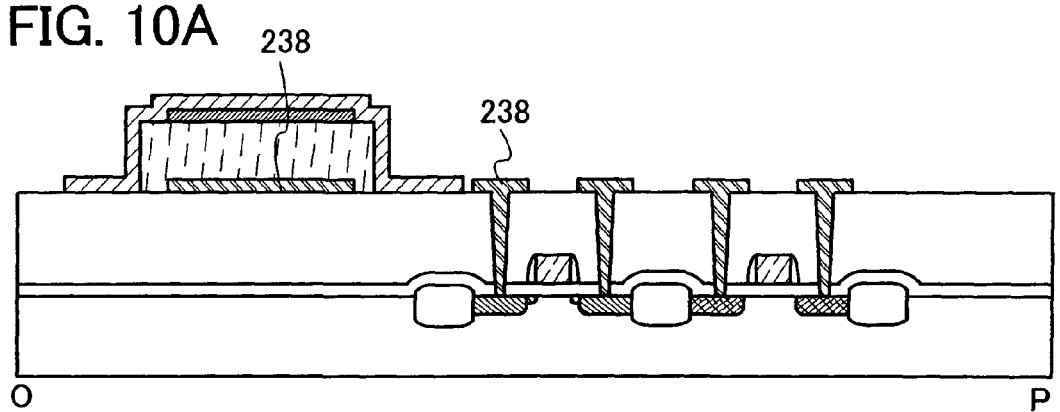
FIGS. 10A and 10B illustrate examples of a micro-electro-mechanical device including a microstructure body according to one aspect of the present invention.
Figure 10B:
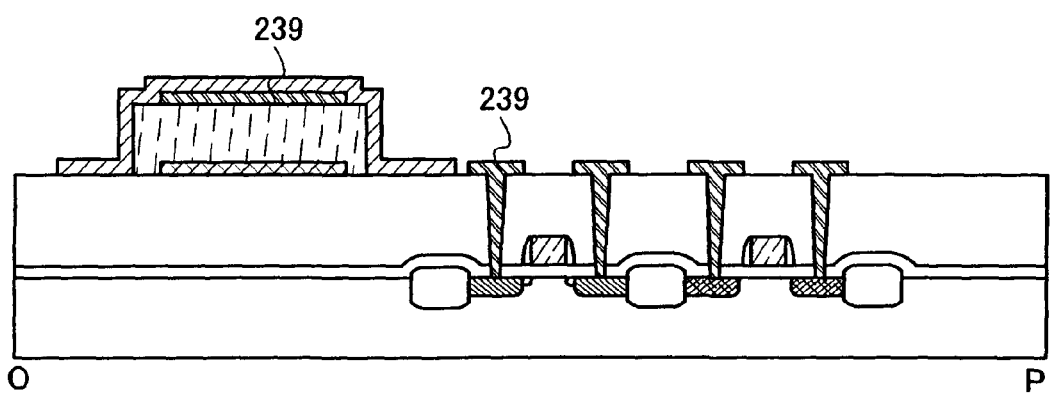

Note that the case is described above in which the thin film transistor is used as the transistor, the present invention is not limited to this case and the transistor may be a field effect transistor (a FET). Further, a silicon-on-insulator (SOI) substrate may be used as the substrate (see FIGS. 10A and 10B). In FIG. 10A, the conductive layer 238 serves as the source or drain electrode layer of the FET and the lower electrode of the microstructure body. In FIG. 10B, the conductive layer 239 serves as the source or drain electrode layer of the FET and the upper electrode of the microstructure body.

Note that although the case where the transistor is formed and then the microstructure body is formed over the interlayer insulating layer formed to cover this transistor is described in this embodiment mode, the present invention is not limited to this case. Each layer of the microstructure body can also be formed while each layer of the transistor is formed, as long as the filler material layer included in the microstructure body is not damaged or deformed, for example, by temperature during the manufacturing process of the transistor, the used chemical solution, or the like. For example, the gate electrode of the transistor and the lower electrode of the microstructure body can be formed by patterning one layer, and the source or drain electrode of the transistor and the upper electrode of the microstructure body can be formed by patterning one layer. This can be realized by using an organic transistor, for example. The term "organic transistor" means a transistor to which an organic semiconductor such as pentacene is applied. An example of a method of manufacturing an organic thin film transistor (hereinafter referred to as an organic TFT) is briefly described below.

Figure 9A:
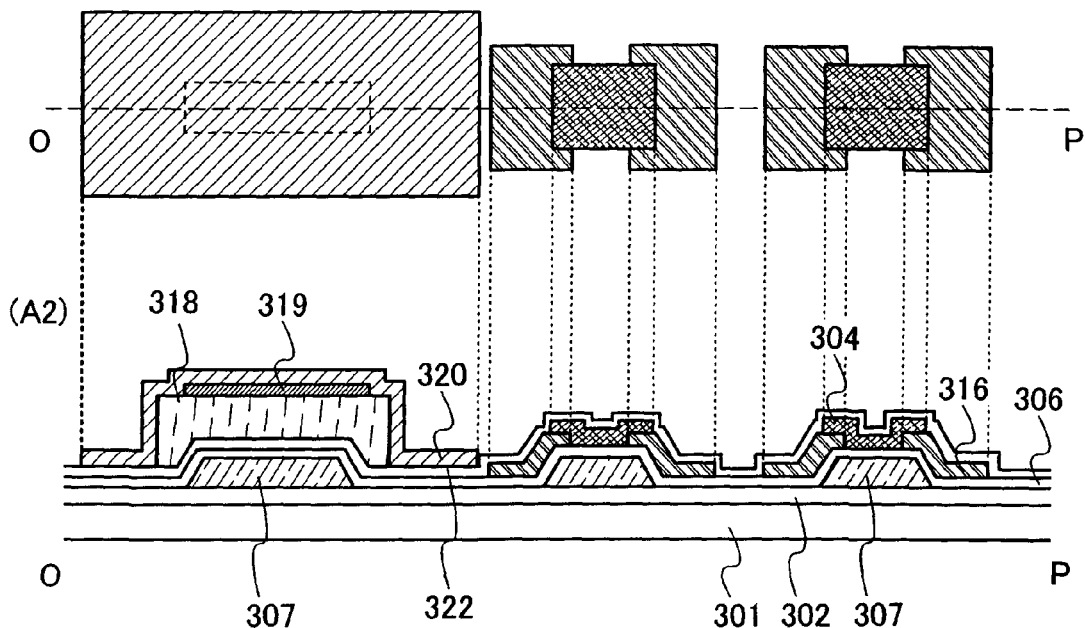

FIGS. 9A-1 and 9A-2 are respectively a top view and a cross-sectional view of the case where a bottom contact organic TFT is used as the transistor. In the case of the bottom contact organic TFT, after a source or drain electrode is formed, an organic semiconductor film is formed.

First, a base film 302 is formed over an insulating substrate 301, and a gate electrode layer 307 is formed over the base film 302. The base film 302 can be formed in a similar manner to that of the base film 202, and the gate electrode layer 307 can be formed in a similar manner to that of the gate electrode layer 207.

Note that as the insulating substrate 301, a substrate similar to the insulating substrate 201 can be used. However, as the insulating substrate 301, a substrate made of a synthetic resin such as plastic typified by polyethylene terephthalate (PET), polyethylene naphthalate (PEN), or polyether sulfone (PES), or acrylic may preferably be used. Such a substrate made of a synthetic resin is flexible and further lightweight.

Further, the gate electrode layer 307 may be formed by a sputtering method, a screen printing method, a roll coater method, a droplet discharging method, a spin coating method, or an evaporation method. For an electrode material, metal, a metal compound, a conducting polymer, or the like may be used.

A droplet discharging method is a method capable of selectively forming a pattern, in which a droplet of a composition into which a material for a conductive film, an insulating film, or the like is mixed is selectively discharged (including jetting) to form the conductive film. A typical example of a droplet discharging method is an inkjet method.

When the conductive film is formed by a droplet discharging method, a conductor is mixed into a solvent. For the conductor which is to be mixed into the solvent, gold, silver, copper, platinum, palladium, tungsten, nickel, tantalum, bismuth, lead, indium, tin, zinc, titanium, or aluminum; an alloy containing any of the above; dispersible nanoparticles of any of the above; or fine particles of silver halide can be used.

When the conductive film is formed by a screen printing method or the like, a conductive paste is used. As the conductive paste, a conductive carbon paste, a conductive silver paste, a conductive copper paste, a conductive nickel paste, or the like can be used. After being formed to have a predetermined pattern, the conductive paste may be dried, subjected to heat treatment at approximately 100 to 200° C. to be planarized (also referred to as leveled), and hardened.

Note that with the gate electrode layer 307, not only the gate electrode of the thin film transistor but also the lower electrode of the microstructure body can be formed.

After the gate electrode layer 307 is formed, a gate insulating film 306 is formed. The gate insulating film 306 may be formed using a material and a method which are similar to those of the gate insulating film 206. Although a CVD method is used here, a sputtering method, spin coating method, an evaporation method, or the like may be alternatively used. Alternatively, a siloxane resin, polysilazane, or the like may be used in a similar manner to that of the interlayer insulating layer 215. Alternatively, as the gate insulating film, an insulating film formed by anodization of the gate electrode may be used.

Next, a filler material layer 318, an upper electrode layer 319, and a structure layer 320 of the microstructure body are formed. The filler material layer 318 may be formed using a material and a method which are similar to those of the filler material layer 102 in Embodiment Mode 1. The upper electrode layer 319 may be formed using a material and a method which are similar to those of the gate electrode layer 307. The structure layer 320 may be formed using a material and a method which are similar to those of the structure layer 104 in Embodiment Mode 1.

Next, a source or drain electrode layer 316 of the thin film transistor is formed over the gate insulating film 306. The source or drain electrode layer 316 can be formed using a material and a method which are similar to those of the gate electrode layer 307. Note that an ohmic contact between the source or drain electrode layer 316 and the organic semiconductor film formed later is needed. Therefore, when an material for the organic semiconductor film has p-type conductivity, a material having a work function higher than the ionization potential of the material for the organic semiconductor film is preferably used; when the material for the organic semiconductor film has n-type conductivity, a material having a work function lower than the ionization potential of the material for the organic semiconductor film is preferably used. Since pentacene that is a p-type material is used as the material for the organic semiconductor film here, tungsten having a relatively high work function is used as the material for the source or drain electrode layer 316. However, there is no limitation to this example.

Next, the organic semiconductor film 304 is formed over the gate insulating film 306 and the source or drain electrode layer 316. As described above, pentacene is used as the material for the organic semiconductor film of this embodiment mode. However, the material for the organic semiconductor film is not limited to this material and may be an organic molecular crystal or an organic high molecular compound. As the organic molecular crystal, specifically, there are polycyclic aromatic compounds, conjugated double bond compounds, carotenes, and macrocycle compounds; complexes of these compounds; phthalocyanine; charge transfer complexes (CT complexes); and the like. For example, it is possible to use anthracene, tetracene, pentacene, hexathiophene (6T), tetracyanoquinodimethane (TCNQ), a tetrathiafulvalene-tetracyanoquinodimethane (TTF-TCNQ) complex, diphenylpicrylhydrazyl (DDPH), a pigment, a protein, a perylenetetracarboxylic acid derivative such as PTCDA, a naphthalenetetracarboxylic acid derivative such as NTCDA, or the like. Further, as the organic high molecular compound, specifically, there are pi-conjugated polymers, phthalocyanine metal complexes, iodine complexes, and the like. In particular, it is preferable to use a pi-conjugated polymer including a conjugated double bond, such as polyacetylene, polyaniline, polypyrrole, polythienylene, a polythiophene derivative, poly(3-alkylthiophene), a polyparaphenylene derivative, or a polyparaphenylenevinylene derivative.

Further, a method by which a film having uniform thickness can be formed may be used for forming the organic semiconductor film 304. Specifically, an evaporation method, a spin coating method, a bar coating method, a solution casting method, a dip coating method, or the like may be used. Here, pentacene that is an organic semiconductor material is formed for the organic semiconductor film 304 over the gate insulating film 306 and the source or drain electrode layer 316 by a vacuum evaporation method that is a kind of evaporation method. Preferably, the organic semiconductor film 304 is selectively formed by formation through a mask, for example.

Note that as pretreatment for forming the organic semiconductor film, ultraviolet light irradiation treatment or plasma treatment may be performed on a surface over which the organic semiconductor film is to be formed. The plasma treatment or the like makes it possible to realize removal of organic substances on the surface over which the organic semiconductor film is to be formed and an improvement in work function (to facilitate electron injection). Alternatively, a film for improving adhesion to the surface over which the organic semiconductor film is to be formed or improving an interface state, for example, a self-assembled monolayer (SAM) film or an orientation film may be formed.

Then, after the organic semiconductor film is formed, the insulating substrate 301 is subjected to heat treatment. The upper limit of the temperature for the heat treatment is lower than the temperature at which the organic semiconductor film 304 is vaporized or decomposed. Heat treatment at a high temperature within this range improves characteristics of the organic TFT. Further, the temperature at this time is preferably less than or equal to the melting point of the organic semiconductor film.

Note that the heat treatment may be performed in an atmosphere but preferably in an inert gas atmosphere of nitrogen, argon, or the like in consideration of deterioration of the organic semiconductor film due to oxygen or water. Furthermore, the heat treatment is more preferably performed in a reduced pressure (e.g., $1.3 \times 10^{-3}$ to $6.7 \times 10^4$ Pa).

Note that the present invention is not limited to the above description, and that the microstructure body may be formed after the organic TFT is formed or the organic TFT may be formed after the microstructure body is formed.

As described above, the bottom contact organic TFT and the microstructure body can be formed over one substrate (see FIGS. 9A-1 and 9A-2).

Note that the organic TFT of the present invention is preferably covered with a protective film. Here, an insulating inorganic film is used as the protective film. By covering the organic TFT with the insulating inorganic film, damage to the organic semiconductor film, which could be caused by the formation of the microstructure body, can be reduced, whereby influence on electrical properties of the organic TFT can be reduced. The protective film 322 covers at least the organic semiconductor film 304.

Note that the organic TFT applied to the present invention is not limited to the above-described bottom contact organic TFT and may be a top contact organic TFT. A method of manufacturing the top contact organic TFT is briefly described below with reference to FIGS. 9B-1 and 9B-2.

First, a gate electrode layer 407 is formed over an insulating substrate 401 using a material and a method which are similar to those in the case of the bottom contact organic TFT, and a gate insulating film 406 is formed to cover the gate electrode layer 407. Note that a base film 402 is formed over the insulating substrate 401.

Note that the gate electrode layer 407 forms not only the gate electrode of the thin film transistor but also the lower electrode of the microstructure body.

Next, a filler material layer 418, an upper electrode layer 419, and a structure layer 420 of the microstructure body are formed. The filler material layer 418 may be formed using a material and a method which are similar to those of the filler material layer 102 in Embodiment Mode 1. The upper electrode layer 419 may be formed using a material and a method which are similar to those of the gate electrode layer 407. The structure layer 420 may be formed using a material and a method which are similar to those of the structure layer 104.

Next, the organic semiconductor film 404 is formed over the gate insulating film 406. Note that pentacene is used as the material for the organic semiconductor film of this embodiment mode as well. However, the material for the organic semiconductor is not limited to this material but may be an organic molecular crystal or an organic high molecular compound. As the organic molecular crystal, specifically, there are polycyclic aromatic compounds, conjugated double bond compounds, carotenes, and macrocycle compounds; complexes of these compounds; phthalocyanine; charge transfer complexes (CT complexes); and the like. For example, it is possible to use anthracene, tetracene, pentacene, hexathiophene (6T), tetracyanoquinodimethane (TCNQ), a tetrathiafulvalene-tetracyanoquinodimethane (TTF-TCNQ) complex, diphenylpicrylhydrazyl (DDPH), a pigment, a protein, a perylenetetracarboxylic acid derivative such as PTCDA, a naphthalenetetracarboxylic acid derivative such as NTCDA, or the like. Further, as the organic high molecular compound, specifically, there are pi-conjugated polymers, phthalocyanine metal complexes, iodine complexes, and the like. In particular, it is preferable to use a pi-conjugated polymer including a conjugated double bond, such as polyacetylene, polyaniline, polypyrrole, polythienylene, a polythiophene derivative, poly(3-alkylthiophene), a polyparaphenylene derivative, or a polyparaphenylenevinylene derivative.

Further, a method by which a film having uniform thickness can be formed may be used for forming the organic semiconductor film 404. Specifically, an evaporation method, a spin coating method, a bar coating method, a solution casting method, a dip coating method, or the like may be used. Here, pentacene that is an organic semiconductor material is formed for the organic semiconductor film 404 over the gate insulating film 406 by a vacuum evaporation method. Preferably, the organic semiconductor film 404 is selectively formed by forming through a mask, for example.

Note that as pretreatment for forming the organic semiconductor film, ultraviolet light irradiation treatment or plasma treatment may be performed on a surface over which the organic semiconductor film is to be formed. The plasma treatment or the like makes it possible to realize removal of organic substances on the surface over which the organic semiconductor film is to be formed and an improvement in work function (to facilitate electron injection). Alternatively, a film for improving adhesion to surface over which the organic semiconductor film is to be formed or improving an interface state, for example, a self-assembled monolayer (SAM) film, an orientation film, or the like may be formed.

Note that here, although the organic semiconductor film 404 is formed after the filler material layer 418 is formed, the filler material layer 418 may be formed after the organic semiconductor film 404 is formed. After the gate electrode layer 407 is formed, the filler material layer 418 may be formed before a source or drain electrode layer 416 is formed. However, in order to improve electrical properties of the organic semiconductor film, the organic semiconductor film 404 is preferably formed after the filler material layer 418 is formed. In that case, the above ultraviolet light irradiation treatment or plasma treatment is preferably performed after the formation of the filler material layer 418 and before the formation of the organic semiconductor film 404.

Then, the source or drain electrode layer 416 is formed. The source or drain electrode layer 416 may be formed using a material and a method which are similar to those in the case of the bottom contact organic TFT.

Note that an ohmic contact between the source or drain electrode layer 416 and the organic semiconductor film 404 is needed. Therefore, when a material for the organic semiconductor film has p-type conductivity, a material having a work function higher than the ionization potential of the material of the organic semiconductor film is preferably used; when the material for the organic semiconductor film has n-type conductivity, a material having a work function lower than the ionization potential of the material of the organic semiconductor film is preferably used. Here, since pentacene that is a p-type material is used as the material for the organic semiconductor film, tungsten having relatively a high work function is used as the material for the source or drain electrode layer 416.

Then, after the organic semiconductor film is formed, the insulating substrate 401 is subjected to heat treatment. The upper limit of the temperature for the heat treatment is lower than the temperature at which the organic semiconductor film 404 is vaporized or decomposed. Heat treatment at a high temperature within this range improves characteristics of the organic TFT. Further, the temperature at this time is preferably less than or equal to the melting point of the organic semiconductor film.

Note that heat treatment may be performed in an atmosphere but preferably in an inert gas atmosphere of nitrogen, argon, or the like in consideration of deterioration of the organic semiconductor film due to oxygen or water. Furthermore, the heat treatment is more preferably performed in a reduced pressure (e.g., $1.3 \times 10^{-3}$ to $6.7 \times 10^4$ Pa).

Note that the present invention is not limited to the above description, and that the microstructure body may be formed after the organic TFT is formed or the organic TFT may be formed after the microstructure body is formed.

Figure 9B:
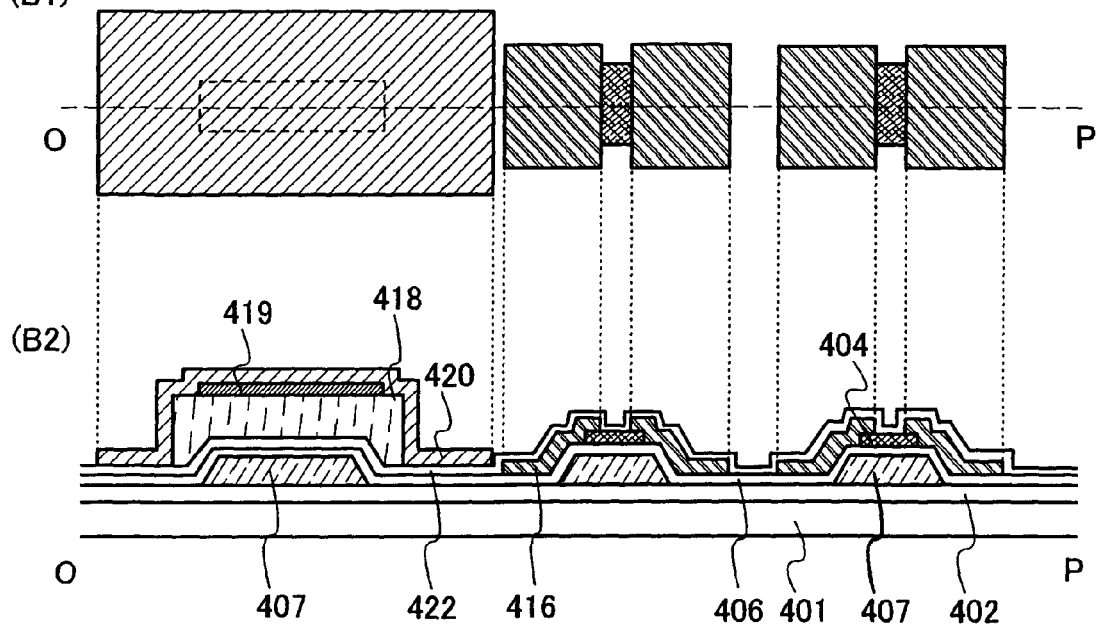

As described above, the bottom contact organic TFT and the microstructure body can be formed over one substrate (see FIGS. 9B-1 and 9B-2).

Note that the organic TFT of the present invention is preferably covered with a protective film. Here, an insulating inorganic film is used as the protective film. By covering the organic TFT with the insulating inorganic film, damage to the organic semiconductor film, which could be caused by the formation of the microstructure body, can be reduced, whereby influence on electrical properties of the organic TFT can be reduced. The protective film 422 covers at least the organic semiconductor film 404.

Note that although the case is described above in which the lower electrode of the microstructure body and the gate electrode of the microstructure body are formed by patterning one layer by one step and the upper electrode of the microstructure body and the source or drain electrode are formed by patterning one layer by one step, the present invention is not limited to this case. For example, even when the organic TFT is used, it is not necessary that the lower electrode of the microstructure body and the gate electrode of the microstructure body are formed by patterning one layer by one step and the upper electrode of the microstructure body and the source or drain electrode are formed by patterning one layer by one step.

Further, according to the present invention, by forming the microstructure and the semiconductor element over one substrate, a semiconductor device which does not need to be assembled or packaged and does not require high manufacturing cost can be provided. Further, manufacturing steps can be greatly reduced.

As described above, it is possible to form the microstructure body of the present invention and the transistor over one substrate. Further, as described above, the microstructure body of the present invention can be manufactured applying any of a variety of methods.

The microstructure body of the present invention, which is manufactured as described above, can be applied to a pressure sensor or a display device or the like using an interference method.

Embodiment Mode 3

By applying the present invention, a strain gauge can be manufactured. In this embodiment mode, a strain gauge to which the present invention is applied is described with reference to drawings.

FIGS. 12A and 12B are schematic views showing the strain gauge manufactured using the microstructure body to which the present invention is applied. Note that FIG. 12B is a top view and FIG. 12A is a cross-sectional view taken along a line X-X' in FIG. 12B.

In the microstructure body shown in FIGS. 12A and 12B, a filler material layer 501 is provided over a substrate 500, a conductive layer 502 is provided over the filler material layer 501, and a structure layer 503 is provided over the conductive layer 502. The conductive layer 502 is patterned so as to have a predetermined length.

Here, the strain gauge is described. The term "strain gauge" means a measuring device that can measure the amount of change in resistance value, which is generated when an object is strained, and can measure the strain amount from this amount of change. This amount of change in resistance value is extremely small and therefore detected by being converted to voltage with the use of a Wheatstone bridge circuit.

Figure 13:
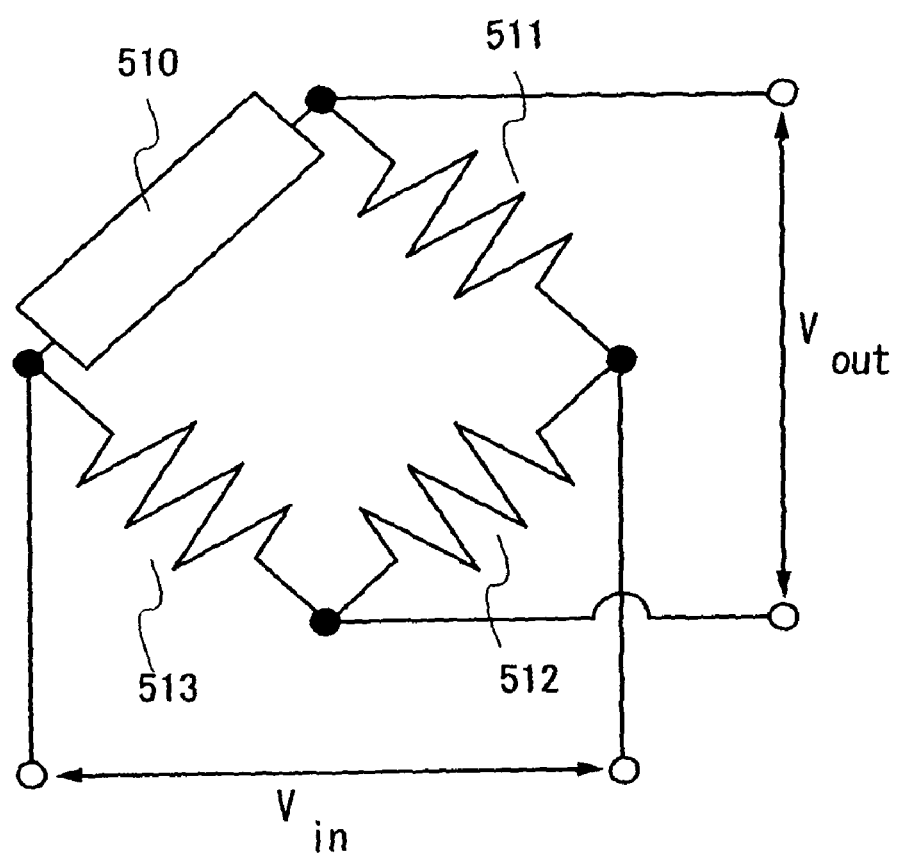
FIG. 13 illustrates a strain gauge to which a microstructure body according to one aspect of the present invention is applied.

FIG. 13 illustrates a Wheatstone bridge circuit used in this embodiment mode. The Wheatstone bridge circuit illustrated in FIG. 13 includes a strain gauge 510, a first resistor element 511, a second resistor element 512, and a resistor element 513, which is a generally well-known structure in which one of four resistor elements included in a Wheatstone bridge circuit is a strain gauge. When r denotes the initial resistance value of the strain gauge, $R_1$ denotes the resistance value of the first resistor element 511, $R_2$ denotes the resistance value of the second resistor element 512, and $R_3$ denotes the resistance value of the third resistor element 513, output voltage $V_{out}$ and input voltage $V_{in}$ satisfy the following equation (4).

$$V_{out} = \frac{rR_2 - R_1R_3}{(r + R_1)(R_2 + R_3)} V_{in} \quad \text{[Equation 4]}$$

Here, in the case of $r=R_1=R_2=R_3=R$, when a strain is introduced to the strain gauge to change the resistance value to $R+\Delta R$, the amount of change $\Delta V_{out}$ in output voltage $V_{out}$ is represented by the following equation (5).

$$V_{out} = \frac{\Delta R}{4R + 2\Delta R} V_{in} \quad \text{[Equation 5]}$$

When the resistance value R is sufficiently large, $\Delta R$ is much less than R, and accordingly $\Delta V_{out}$ is represented by the following equation (6).

$$\Delta V_{out} = \frac{\Delta R}{4R + 2\Delta R} V_{in} = \frac{V_{in}}{4} \varepsilon K \qquad \text{[Equation 6]}$$

Here, K denotes an experimentally obtained gauge rate and is a constant value. The equation $\varepsilon K = \Delta R/R$ is satisfied between the strain amount $\varepsilon$ and the gauge rate K. Therefore, by measuring $\Delta R$, the strain amount $\varepsilon$ can be obtained. The strain gauges described in this embodiment mode may be arranged in matrix.

Manufacture of the strain gauge by applying the microstructure body of the present invention makes it possible to prevent the structure layer from being damaged. Thus, a strain gauge having a movable portion with high mechanical strength and high reliability can be provided. Further, yield in the manufacturing process of the strain gauge can be improved.

This application is based on Japanese Patent Application serial no. 2007-289224 filed with Japan Patent Office on Nov. 7, 2007, the entire contents of which are hereby incorporated by reference.

What is claimed is:

1. A micro-electro-mechanical device comprising:
   a microstructure body, the microstructure body comprising:
   a lower electrode layer on an insulating surface;
   a filler material layer over the lower electrode layer;
   an upper electrode layer overlapping with the lower electrode layer with the filler material layer interposed therebetween; and
   a structure layer over the upper electrode layer,
   wherein the structure layer includes a portion capable of moving, and
   wherein the filler material layer comprises an insulating material including plural pores.

2. The device according to claim 1, wherein the plural pores include pores reaching a surface of the filler material layer.

3. The device according to claim 1, wherein percentage of the plural pores included in the filler material layer is greater than or equal to 20 and less than or equal to 80.

4. The device according to claim 1, wherein the filler material layer includes a block copolymer.

5. The device according to claim 4, wherein the block copolymer includes at least one material selected from a group consisting of hydrophobic aromatic hydrocarbon, hydrophobic aliphatic unsaturation hydrocarbon, hydrophilic aliphatic hydrocarbon, hydrophilic aromatic hydrocarbon, hydrophobic siloxane, and metal complex.

6. The device according to claim 4, wherein the block copolymer includes at least one material selected from a group consisting of polymethylmethacrylate, polystyrene, polyfluorene, polybutadiene, polyisoprene, polyvinyl alcohol, polyethylene glycol, polyvinyl pyridine, polystyrene sulfonic acid, poly dimethylsiloxane, and poly ferrocene.

7. The device according to claim 1, wherein the filler material layer has a cylinder structure, a gyroid structure, or a lamellar structure.

* * * * *